(12) United States Patent
Messe et al.

(10) Patent No.: US 8,362,148 B2
(45) Date of Patent: Jan. 29, 2013

(54) CURABLE COMPOSITION

(75) Inventors: Loic Messe, Blotzheim (FR); Carole Chapelat, Saint-Louis (FR)

(73) Assignee: 3D Systems, Inc., Rock Hill, SC (US)

( * ) Notice: Subject to any disclaimer, the term of this patent is extended or adjusted under 35 U.S.C. 154(b) by 555 days.

(21) Appl. No.: 12/530,887

(22) PCT Filed: Mar. 12, 2008

(86) PCT No.: PCT/EP2008/052901
§ 371 (c)(1),
(2), (4) Date: Sep. 11, 2009

(87) PCT Pub. No.: WO2008/110564
PCT Pub. Date: Sep. 18, 2008

(65) Prior Publication Data
US 2010/0104832 A1     Apr. 29, 2010

(30) Foreign Application Priority Data

Mar. 14, 2007  (EP) ..................................... 07005266

(51) Int. Cl.
*C08F 2/44* (2006.01)
(52) U.S. Cl. ......................... 525/94; 525/330.1; 522/168
(58) Field of Classification Search .................. 522/168; 525/94, 330.1
See application file for complete search history.

(56) References Cited

U.S. PATENT DOCUMENTS

2002/0132872 A1   9/2002   Yamamura et al.
2004/0034124 A1   2/2004   Court et al.

OTHER PUBLICATIONS

Fine, et al., "Structures and rheological properties of reactive solutions of block copolymers, Part I. Diblock copolymers in a liquid epoxy monomer," Polymer, Elsevier Science Publishers B.V., GB, vol. 46, No. 17, Aug. 8, 2005, pp. 6605-6613.

*Primary Examiner* — Vu A Nguyen

(57) ABSTRACT

The present invention provides a curable composition comprising:
(a) a resin composition being liquid at 23° C. and comprising monomers or oligomers or a mixture of monomers and oligomers polymerizable by a ring-opening reaction;
(b) an impact modifier containing one or more block copolymers having at least one block composed of methyl methacrylate and
(c) one or more polymerization initiators.

The curable resin composition can be used for curable coatings per se and in specific for stereolithography and other applications such as three dimensional printing applications where a 3D object is formed.

12 Claims, No Drawings

CURABLE COMPOSITION

CROSS REFERENCE TO RELATED APPLICATIONS

This application is the National Phase of International Application PCT/EP2008/052901 filed Mar. 12, 2008 which designated the U.S. and which claims priority to European (EP) Pat. App. No. 07005266.7 filed Mar. 14, 2007. The noted applications are incorporated herein by reference.

TECHNICAL FIELD

This invention relates to curable compositions comprising a resin composition, a block copolymer as impact modifier and a photoinitiator. Further, the invention relates to a process for preparing the curable compositions and the use in rapid prototyping or free form fabrication, as coating composition, paint, moulding composition, dipping resin, casting resin, impregnating resin, or laminating resin.

BACKGROUND OF THE INVENTION

Photocurable resins are of continuing interest because they are regarded as 'green' solutions, not requiring solvents nor, if containing water, energy intensive water drying resources. Within this area, it is of growing interest to provide photocurable resin compositions which after curing result in high toughness and increased thermal properties. Such desired properties are particularly sought in three dimensional printing applications.

For example, liquid-based Solid Imaging is a process whereby a photoformable liquid is coated into a thin layer upon a surface and exposed imagewise to actinic radiation, for example UV directed by laser for StereoLithography 'SL', such that the liquid solidifies imagewise. Subsequently, new thin layers of photoformable liquids are coated onto previous layers of liquid or previously solidified sections. The new layers are then exposed imagewise in order to solidify portions imagewise and in order to induce adhesion between portions of the new hardened region and portions of the previously hardened region. Each imagewise exposure is of a shape that relates to a pertinent cross-section of a photohardened object such that when all the layers have been coated and all the exposures have been completed, an integral photohardened object can be removed from the surrounding liquid composition.

One of the most important advantages of the solid imaging process is the ability to rapidly produce actual articles that have been designed by computer aided design. A significant amount of progress has been made with compositions and processes that have been adapted to improve the accuracy of the articles produced. Also, composition developers have made significant progress toward improving individual properties such as the tensile modulus or Heat Deflection Temperature (also called HDT being the temperature at which a sample of material deforms under a specified load) of the photohardened articles. Typically, a material with a higher HDT will perform better, that is, resist distortion better, in high-heat situations.

Rapid prototyping users wish to obtain quickly functional parts with good mechanical properties similar to those obtained by e.g.: injection molding or extrusion. Further it is desirable to produce parts with which, for examples, are achieved (1) high green strength which allows an easier handling of the parts at the end of the build and (2) outstanding toughness comparable to those of the acrylonitrile-butadiene-styrene "ABS" and polycarbonate thermoplastic polymers. These requirements are not only a customer request for rapid prototyping, but it is also, compulsory if SL or jetting resins are used for rapid manufacturing applications.

Additionally, it would be desirable to produce a clear photocurable composition which, for example, upon cure in a stereolithography process produces an article having the properties and feel of the manufacturing material acrylonitrile-butadiene-styrene ("ABS") and polycarbonate (PC). Especially important for the laser based stereolithography process are formulations based on epoxy-acrylic resin mixtures. These formulations further require tougheners to produce balanced mechanical properties.

In EP1290088, it is disclosed that the addition of triblock copolymers having at least one block predominantly composed of methyl methacrylate units to epoxy compositions results in epoxy materials with improved impact resistance.

The patent application WO 03/063572 describes thermoset materials with improved impact strength, obtained from compositions comprising a hardenable resin, typically epoxy resin, a polyamide resulting from the condensation of at least one diacid and at least one diamine, and possibly an impact modifier selected from SBM, BM and MBM copolymers.

There is a general need in improving the properties of the cured resins as such used for stereolithography and the products made thereof, as well as the initial storage properties of the uncured composition and in the intermediate green model and the final cured product. The green model is an object of a well-defined shape obtained by iterative layer depositions and irradiations. The green model is, in general, not fully cured and has a lower strength (greenstrength) than the final part, and must therefore be submitted to a post-curing process.

It is therefore an object of the present invention to provide a resin composition suitable for the use in photocurable coatings per se, and in specific for stereolithography and other such three dimensional printing applications where a 3D object is formed, showing improved properties compared to those of the state of art. It is a further object to improve the impact resistance of the cure article in accordance with the specific requirements.

SUMMARY OF THE INVENTION

It now has surprisingly been found that the high impact resistance, high green flexural modulus, high bend modulus and high tensile modulus of curable resins, preferably those photocurable resins having cationic ring opening condensation materials, such as for example epoxy materials, is significantly improved when the resins contain a block copolymer having at least one block composed of methyl methacrylate as a toughener.

This improved set of properties is caused by the incorporation of new additives which remarkably toughen the cured parts. Usually, the addition of simple tougheners generates an increase of toughness and flexibility but with decrease of either heat deflection temperature (HDT), or green strength and overall product performances. In the present disclosure, the additives used not only toughen the parts but also improve the overall mechanical properties of the final parts, through a phase separation process. It is additionally usually difficult to achieve phase separation during the rapid radiation exposure conditions employed in the preferred process [3D printing, via laser, or digital UV cure]: the particular compositions described achieve the toughening phase separation especially involving self-ordering of polymeric chains, at a nanometric level, which is believed to be at the origin of the improved properties found. Resultant resins with this type of additive exhibit a better overall set of properties without compromising other properties, such as flexibility and HDT. The resin may be liquid or paste-liquid.

DETAILED DESCRIPTION OF THE INVENTION

The subject of the present invention is therefore a curable composition comprising:
(a) a resin composition being liquid at 23° C. and comprising monomers or oligomers or a mixture of monomers and oligomers polymerizable by a ring-opening reaction;
(b) an impact modifier containing one or more block copolymers having at least one block composed of methyl methacrylate and
(c) one or more polymerization initiators.

Resin (a)

As the first component (a), the composition contains a resin based on monomers or oligomers or a mixture of monomers and oligomers being liquid at 23° C. and polymerizable by a ring-opening reaction.

The term "liquid at 23° C." as used within the terms of present invention means viscosities between 1 and 3000 mPa·s measured at 30° C., measured with a Brookfield model RVT or Brookfield model LVT DV II, with spindle SC4-18 or SC4-21 according to the technical data sheet from Brookfield. The spindles can be used either on the RVT or LVT viscosimeter. The speed is between 0.5 and 100 rpm on the RVT viscosimeter, and between 0.6 and 30 rpm on the LVT DV II viscosimeter.

The monomers or oligomers of component (a) are preferably epoxy resins selected from cycloaliphatic, aromatic and hydrogenated aromatic epoxy resin compositions and any mixtures thereof.

The term "epoxy resin" denotes any oxirane type, conventional epoxy resin which is preferably liquid at room temperature (23° C.) or at a higher temperature. These epoxy resins can be monomeric, oligomeric or polymeric, on the one hand, aliphatic, cycloaliphatic, heterocyclic or aromatic, on the other hand. For the avoidance of doubt, in case an epoxy containing compound (a) has additional functional groups, it is nevertheless counted as epoxy containing component (a). Mention may be made, as examples of such epoxy resins, of polymers compatible with impact modifier (b), such as epoxidized polybutadiene or others, resorcinol diglycidyl ether, bisphenol A diglycidyl ether, triglycidyl-p-amino-phenol, bromobisphenol F diglycidyl ether, the triglycidyl ether of m-amino-phenol, tetraglycidymethylenedianiline, the triglycidyl ether of (trihydroxy-phenyl)methane, polyglycidyl ethers of phenol-formaldehyde novolak, polyglycidyl ethers of ortho-cresol novolak and tetraglycidyl ethers of tetraphenyl-ethane. A mixture of liquid epoxy containing a solid epoxy is also envisaged, such that the combination is a liquid resin: thus the solid epoxy is defined as having a melting point slightly above ambient temperature of 23° C. and is soluble in the liquid epoxy which is a flowing liquid at ambient temperatures, e.g. 23° C. Preferably for the stereolithography or the jetting applications the ambient viscosity is less than 1000 mPa·s, more preferably less than 500 mPa·s, and even more preferably less than 250 mPa·s.

According to the present invention the term compatible means that the resin composition (a) and the impact modifier (b) are miscible in the curable composition in its uncured state, i.e. they do not phase separate out prematurely during storage prior to use.

Hydrogenated aromatic derivatives of the epoxy resins having aromatic groups are further preferred. Mixtures of at least two of these resins can also be used. Hydrogenated or perhydrogenated aromatic means the aromatic double bonds are partially or fully hydrogenated.

Epoxy resins are, for example, those which contain groups of the formula A

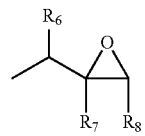

in which either $R^6$ and $R^8$ are each a hydrogen atom, in which case $R^7$ is then a hydrogen atom or a methyl group, or $R^6$ and $R^8$ together are —$CH_2$—$CH_2$— or —$CH_2$—$CH_2$—$CH_2$—, in which case $R^7$ is then a hydrogen atom, bonded directly to oxygen, nitrogen or sulfur atoms.

Examples, which may be mentioned, of such resins are polyglycidyl esters and poly-(.beta.-methylglycidyl) esters, which can be obtained by reaction of a compound containing two or more carboxylic acid groups per molecule with epichlorohydrin, glycerol dichlorohydrin or .beta.-methyl-epichlorohydrin in the presence of an alkali. Such polyglycidyl esters can be derived from aliphatic polycarboxylic acids, for example oxalic acid, succinic acid, glutaric acid, adipic acid, pimelic acid, suberic acid, azelaic acid, sebacic acid or dimerized or trimerized linoleic acid, from cycloaliphatic polycarboxylic acids, such as tetrahydrophthalic acid, 4-methyltetrahydrophthalic acid, hexahydrophthalic acid and 4-methylhexahydrophthalic acid, and from aromatic polycarboxylic acids or their perhydrogenated counterparts of polycarboxylic acids, such as phthalic acid, isophthalic acid and terephthalic acid.

Other examples are polyglycidyl ethers and poly-(.beta.-methylglycidyl)ethers which are obtainable by reaction of a compound containing at least two free alcoholic and/or phenolic and/or perhydrophenolic hydroxyl groups per molecule with the corresponding epichlorohydrin under alkaline conditions, or in the presence of an acid catalyst, with subsequent treatment with an alkali. These ethers can be prepared using epichlorohydrin reacted with acyclic alcohols, such as ethylene glycol, diethylene glycol and higher poly-(oxyethylene) glycols, propane-1,2-diol and poly-(oxypropylene) glycols, propane-1,3-diol, butane-1,4-diol, poly-(oxotetramethylene) glycols, pentane-1,5-diol, hexane-1,6-diol, hexane-2,4,6-triol, glycerol, 1,1,1-trimethylolpropane, pentaerythritol and sorbitol, from cycloaliphatic alcohols, such as resorcitol, quinitol, bis-(4-hydroxycyclohexyl)-methane, 2,2-bis-(4-hydroxycyclohexyl)-propane and 1,1-bis-(hydroxymethyl)-cyclohex-3-ene, and from alcohols having aromatic groups, such as N,N-bis-(2-hydroxyethyl)-aniline and p,p'-bis-(2-hydroxyethylamino)-diphenylmethane. They can furthermore be prepared from mononuclear phenols, such as resorcinol and hydroquinone, as well as polynuclear phenols, such as bis-(4-hydroxyphenyl)-methane, 4,4-dihydroxydiphenyl, bis-(4-hydroxyphenyl) sulfone, 1,1,2,2-tetrakis-(4-hydroxyphenyl)-ethane, 2,2-bis-(4-hydroxyphenyl)-propane (otherwise known as bisphenol A) and 2,2-bis-(3,5-dibromo-4-hydroxyphenyl)-propane, as well as novolaks formed from aldehydes, such as formaldehyde, acetaldehyde, chloral and furfurol, with phenols, such as phenol itself and phenol which is substituted on the ring by chlorine atoms or alkyl groups having in each case up to nine carbon atoms, such as 4-chlorophenol, 2-methylphenol and 4-tert-butylphenol. Perhydrogenated aromatic versions are also important and in some cases preferred, as they yield greater stability in the cured part when left/used in e.g. sunlight.

Poly-(N-glycidyl) compounds include, for example, triglycidyl isocyanurate and N,N'-diglycidyl derivatives of cyclic alkyleneureas, such as ethyleneurea and 1,3-propyleneurea, and hydantoins, such as 5,5-dimethylhydantoin.

Poly-(S-glycidyl) compounds are, for example, the di-S-glycidyl derivatives of dithiols, such as ethane-1,2-dithiol and bis-(4-mercaptomethylphenyl)ether.

Examples of epoxy resins containing groups of the formula A in which $R^6$ and $R^8$ together are a —$CH_2$—$CH_2$— group. These are the so-called "non-glycidyl epoxy compounds"; examples are bis-(2,3-epoxycyclopentyl) ether, 2,3-epoxycyclopentyl glycidyl ether, 1,2-bis-(2,3-epoxycyclopentyloxy)-ethane and 3,4-epoxycyclohexylmethyl 3',4'-epoxycyclohexanecarboxylate.

Epoxy resins in which the 1,2-epoxide groups are bonded to different types of hetero atoms, for example the N,N,O-triglycidyl derivative of 4-aminophenol, the glycidyl ether/glycidyl ester of salicyclic acid or p-hydroxybenzoic acid, N-glycidyl-N'-(2-glycidyloxypropyl)-5,5-dimethylhydantoin and 2-glycidyloxy-1,3-bis-(5,5-dimethyl-1-glycidyl-3-hydantoinyl)-propane, are also suitable.

Aromatic epoxy resins, such as diglycidyl ethers of bisphenols and their hydrogenated derivates are especially preferred. Ternary mixtures of these above resins with for example aliphatic multiglycidyl epoxy resins are also contemplated. Amongst these multiglycidyl epoxy resins are those derived from short or long chain multi alcohols.

Also conceivable is the use of liquid pre-reacted adducts of epoxy-containing compounds, such as those mentioned above, with suitable hardeners for epoxy resins. It is of course also possible to use liquid mixtures of liquid or solid epoxy resins in the novel compositions.

The following are examples of commercial epoxy-containing compounds suitable for use singly or as mixtures in the present invention: Uvacure® 1500 (3,4-epoxycyclohexylmethyl-3',-4'-epoxycyclohexanecarboxylate, available from UCB Chemicals Corp.); Epalloy® 5000 (epoxidized hydrogenated Bisphenol A, available from CVC Specialties Chemicals, Inc.) Heloxy® 48 (trimethylol propane triglycidyl ether, available from Resolution Performance Products LLC); Heloxy® 107 (diglycidyl ether of cyclohexanedimethanol, available from Resolution Performance Products LLC); Uvacure® 1501 and 1502 which are proprietary cycloaliphatic epoxides, Uvacure® 1530-1534 which are cycloaliphatic epoxides blended with a proprietary polyol, Uvacure® 1561 and Uvacure® 1562 which are proprietary cycloaliphatic epoxides having a (meth)acrylic unsaturation (all available from UCB Chemicals Corp.); Cyracure® UVR-6100, -6105, -6107, and -6110 which are all 3,4-epoxycyclohexylmethyl-3',4'-epoxycyclohexanecarboxylate, Cyracure® UVR-6128, a bis(3,4-epoxycyclohexyl) adipate (all available from Dow Chemical Co.); Araldite® CY 179, a 3,4-epoxycyclohexylmethyl-3',4'-epoxycyclohexanecarboxylate and Araldite® PY 284, a digycidyl hexahydrophthalate polymer (available from Huntsman Advanced Materials Americas Inc.); Celloxide® 2021, a 3,4-epoxycyclohexyl methyl-3',4'-epoxycyclohexyl carboxylate, Celloxide® 2081, a 3,4-epoxycyclohexanemethyl 3'-4'-epoxycyclohexyl-carboxylate modified caprolactone, Celloxide® 2083, Celloxide® 2085, Celloxide® 2000, Celloxide® 3000, Epolead® GT-300, Epolead® GT-302, Epolead® GT-400, Epolead® 401, Epolead® 403 (all available from Daicel Chemical Industries Co., Ltd.) DCA, an alicyclic epoxy (available from Asahi Denka Co. Ltd); and E1, an epoxy hyperbranched polymer obtained by the polycondensation of 2,2-dimethylolpropionic acid functionalized with glycidyl groups (available from Perstorp AB), epoxy novolac resins such as Tactix, Araldite® ECN, Araldite® EPN and Araldite® PY307-1 (available from Huntsman). The epoxy used can also be a siloxane or fluoro based epoxy such as: 1,3-bis(3-(2,3-epoxypropoxy)-propyl)tetramethyldisiloxane, epoxidized cyclic silanes such as 2,4,6,8,10-pentakis(3-(2,3-epoxypropoxy)propyl)-2,4,6,8,10 pentamethylcyclopentasiloxane.

In a preferred embodiment component (a) comprises an oxetane monomeric or oligomeric compound. The oxetane compound may be a mono- or multifunctional oxetane compound as described below. These compounds may be used as component (a) or in a mixture with other compounds such as epoxy compounds.

Examples may be represented by the following formula

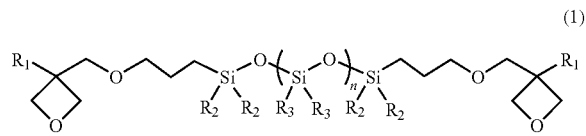

wherein $R_1$ represents a hydrogen atom, fluorine atom, an alkyl group having 1-6 carbon atoms such as methyl group, ethyl group, propyl group and butyl group, a fluoroalkyl group having 1-6 carbon atoms such as trifluoromethyl group, perfluoroethyl group, and perfluoropropyl group, an aryl group having 6-18 carbon atoms such as a phenyl group and naphthyl group, a furyl group, or a thienyl group;

wherein $R_2$ represents an alkyl group having 1-4 carbon atoms or an aryl group having 6-18 carbon atoms for example a phenyl group or naphthyl group;

n is an integer from 0-200;

wherein $R_3$ represents an alkyl group having 1-4 carbon atoms, an aryl group having 6-18 carbon atoms for example a phenyl group or naphthyl group, or a group shown by the following formula (2):

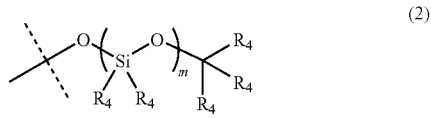

wherein $R_4$ represents an alkyl group having 1-4 carbon atoms, an aryl group having 6-18 carbon atoms for example a phenyl group or naphthyl group, and m is an integer from 0-100.

As a specific example of the previously mentioned molecule (1), here is presented:

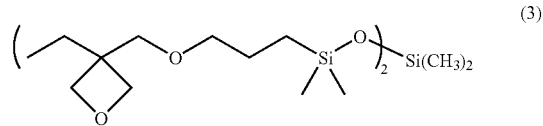

Multifunctional Oxetane:

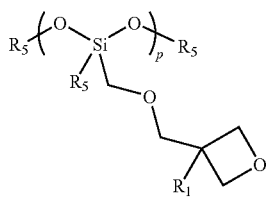
(4)

Wherein $R_5$ represents an alkyl group having 1-4 carbon atoms or trialkylsilyl group (wherein each alkyl group individually is an alkyl group having 1-12 carbon atom), for example a trimethylsilyl group, triethylsilyl group, tripropylsilyl group, or tributylsilyl group, $R_1$ is the same as defined in the previous formula (1).

And p is an integer from 1-10.

As a specific example of the previously mentioned molecule (4), here is presented:

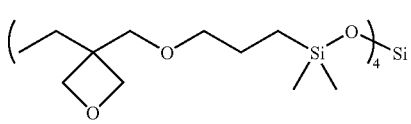
(5)

The following compounds are given as examples of oxetane compounds having one oxetane ring in the compound which may be used in the present invention: 3-ethyl-3-hydroxymethyloxetane, 3-(meth)allyloxymethyl-3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl(3-ethyl-3-oxetanylmethyl)ether, isobornyloxymethyl(3-ethyl-3-oxetanylmethyl)ether, isobornyl(3-ethyl-3-oxetanylmethyl)ether, 2-ethylhexyl(3-ethyl-3-oxetanylmethyl)ether, ethyldiethylene glycol(3-ethyl-3-oxetanylmethyl)ether, dicyclopentadiene(3-ethyl-3-oxetanylmethyl)ether, dicyclopentenyloxyethyl(3-ethyl-3-oxetanylmethyl)ether, dicyclopentenyl(3-ethyl-3-oxetanylmethyl)ether, tetra-hydrofurfuryl(3-ethyl-3-oxetanylmethyl)ether, tetrabromophenyl(3-ethyl-3-oxetanyl-methyl)ether, 2-tetrabromophenoxyethyl(3-ethyl-3-oxetanylmethyl)ether, tribromo-phenyl(3-ethyl-3-oxetanylmethyl)ether, 2-tribromophenoxyethyl(3-ethyl-3-oxetanyl-methyl)ether, 2-hydroxyethyl(3-ethyl-3-oxetanyl methyl)ether, 2-hydroxypropyl(3-ethyl-3-oxetanylmethyl) ether, butoxyethyl(3-ethyl-3-oxetanylmethyl)ether, pentachlorophenyl(3-ethyl-3-oxetanylmethyl)ether, pentabromophenyl(3-ethyl-3-oxetanylmethyl)ether, bornyl(3-ethyl-3-oxetanylmethyl)ether, and the like. Other examples of oxetane compounds suitable for use include trimethylene oxide, 3,3-dimethyloxetane, 3,3-dichloromethyloxetane, 3,3-[1,4-phenylene-bis(methyleneoxymethylene)]-bis(3-ethyloxetane), 3-ethyl-3-hydroxymethyl-oxetane, and bis-[(1-ethyl(3-oxetanyl)methyl)]ether.

Examples of compounds having two or more oxetane rings in the compound which may be used in the present invention include: 3,7-bis(3-oxetanyl)-5-oxa-nonane, 3,3'-(1,3-(2-methylenyl)propanediylbis(oxymethylene))bis-(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methy]propane, ethylene glycol bis(3-ethyl-3-oxetanylmethyl)ether, dicyclopentenyl bis(3-ethyl-3oxetanylmethyl)ether, triethylene glycol bis(3-ethyl-3oxetanylmethyl)ether, tetraethylene glycol bis(3-ethyl-3-oxetanylmethyl)ether, tricyclodecanediyldimethylene(3-ethyl-3-oxetanylmethyl) ether, trimethylolpropane tris(3-ethyl-3-oxetanylmethyl) ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl)ether, pentaerythritol tetrakis(3-ethyl-3-oxetanylmethyl)ether, poly-ethylene glycol bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritol tetrakis(3-ethyl-3-oxetanylmethyl)ether, caprolactone-modified di-pentaerythritol hexakis(3-ethyl-3-oxetanylmethyl)ether, caprolactone-modified di-pentaerythritol pentakis(3-ethyl-3-oxetanylmethyl)ether, ditrimethylolpropane tetrakis-(3-ethyl-3-oxetanylmethyl)ether, EO-modified Bisphenol A bis (3-ethyl-3-oxetanyl-methyl)ether, PO-modified Bisphenol A bis(3-ethyl-3-oxetanylmethyl)ether, EO-modified hydrogenated Bisphenol A bis(3-ethyl-3-oxetanylmethyl)ether, PO-modified hydrogenated Bisphenol A bis(3-ethyl-3-oxetanyl-methyl)ether, EO-modified Bisphenol F (3-ethyl-3-oxetanylmethyl)ether, and the like.

Of the above compounds, it is preferable that the oxetane compounds have 1-10, preferably 1-4, and even more preferably 1 oxetane rings in the compound. Specifically, 3-ethyl-3-hydroxymethyl oxetane, (3-ethyl-3-oxetanylmethoxy)methylbenzene, 1,4-bis[(3-ethyl-3-oxetanylmethoxy)methyl] benzene, 1,2-bis(3-ethyl-3-oxetanylmethoxy)ethane and trimethylolpropane tris(3-ethyl-3-oxetanylmethyl)ether are preferably used. Commercially available oxetane compounds include Cyracure® UVR 6000 (available from Dow Chemical Co.) and Aron Oxetane OXT-101, OXT-121, OXT-211, OXT-212, OXT-221, OXT-610 and OX-SQ (available from Toagosei Co. Ltd.).

The curable compound (a) may also be a cyclic ether compound, cyclic lactone compound, cyclic acetal compound, cyclic thioether compound, spiro orthoester compound or vinylether compound.

Furthermore, as noted above, it is possible that the component (a) of the present invention includes a mixture of the compounds described above.

In one embodiment, the component (a) includes at least one hydrogenated bisphenol epoxy-containing compound having an average epoxy functionality of at least 2 and an epoxy equivalent weight (EEW) between 100 and 700. The hydrogenated bisphenol epoxy-containing compound may be present in the curable composition at a proportion of at least about 5% by weight, more preferably at least about 15% by weight, and even more preferably at least about 30% by weight based on the total weight of the curable composition. In yet another embodiment, the hydrogenated bisphenol epoxy-containing compound may be present in an amount of at most 97% by weight, preferably in an amount of at most 85% by weight, and even more preferably in an amount of at most 70% by weight based on the total weight of the curable composition. In yet a further embodiment, the hydrogenated bisphenol epoxy-containing compound may be present in the range of from about 5-97% by weight, preferably from about 15-85% by weight and even more preferably from about 30-70% by weight based on the total weight of the curable composition.

In another embodiment, the component (a) may further include one or more oxetane compounds so that the oxetane is preferably present in the curable composition in an amount of at least about 1% by weight, more preferably in an amount of at least about 10% by weight and even more preferably in an amount of at least 15% by weight based on the total weight of the curable composition. In yet another embodiment, the oxetane compound may be present in an amount of at most 97% by weight, more preferably in an amount of at most 50% by weight, and even more preferably in an amount of at most 25% by weight based on the total weight of the curable composition. In yet a further embodiment, the oxetane compound may be present in an amount of 0.01-40% by weight, more preferably 0.1-30% by weight, and even more preferably in a amount of 0.5-22% by weight based on the total weight of the curable composition.

In yet another embodiment, the component (a) may further include one or more difunctional non-glycidyl epoxy compounds. The difunctional non-glycidyl epoxy compound may be present in the curable composition in an amount of 0.1-97% by weight, more preferably 0.5-85% by weight, and even more preferably in an amount of 1-70% by weight based on the total weight of the curable composition.

The total amount of component (a) present in the curable composition may generally be at least 5% by weight, more preferably at least 15% by weight, and even more preferably at least 30% by weight based on the total weight of the curable composition; the amount of component (a) should not exceed about 97% by weight in total, more preferably 85% by weight, and even more preferably it should not exceed 70% by weight, based on the total weight of the curable composition. In one embodiment, the total amount of the resin composition (a) present is in the range of from about 5-97% by weight, preferably from about 15-85% by weight, and even more preferably from about 30-70% by weight based on the total weight of the curable composition.

Impact Modifier (Component (b))

The second component of the resin composition of the present invention is the impact modifier (b) containing one or more block copolymers having at least one block composed of methyl methacrylate. Preferred are block copolymers which are constituted of three blocks of linear chains covalently bonded to one another, and which exhibit a microscopic phase separation. Said family may comprise S-B-M and the M-B-M-triblock copolymers.

Preferably, the impact modifier is compatible with the resin (a).

The term compatible is already defined above and means that the block-co-polymers or the mixture of block copolymers are soluble in the curable composition, and do not phase separate out prematurely during storage prior to use.

In a preferred embodiment, the curable composition comprises one or more block copolymers containing at least one block comprising methyl methacrylate, wherein the block copolymers form microscopic phases upon curing of the composition. That means the copolymers dissolve in the component (a) and form micellar domains within the solution. The cured product shows self-ordered structures of these copolymers, further they exhibit microscopic phase separation when investigated by X-ray or neutron scattering or SEM (scanning electron microscopy) or TEM (transmission electron microscopy) or any another means of analysis. Preferably the structures have micelle domains. These micelle domains have a diameter from 10 to 800 nm and act as impact resistant phases in the cured article. The phases obtained by self-ordering of the block copolymer can be regarded as a nanometric structure. Since the block copolymers are first dissolved in the curable composition and form the micelles upon curing, the size of these micelles can be adjusted according to the specific requirements. Thus a broad range of toughening can be obtained.

In a further preferred embodiment the curable composition of present invention contains combinations of block copolymers and core-shell polymers as impact modifier.

Preferably the impact modifier (b) is a S-B-M-triblock copolymer or a M-B-M-triblock copolymer, wherein the S-block and the M-block independently of each other comprise vinylaromatic compounds and/or alkyl esters of acrylic acid and/or methacrylic acid having from 1 to 18 carbon atoms in the alkyl chain and the B-block comprises diene or alkyl(meth)acrylate), with the provisions that at least one of the S-block, B-block and M-block is composed of methyl methacrylate, and that the M-block and the B-block and the S-block and the B-block are incompatible.

In a further embodiment the M-block comprises at least 50% by weight of methyl methacrylate monomers and the other monomers M2 comprise non-acrylic vinyl and/or (meth)acrylic monomers different from the monomers M1.

Incompatible means that if the homopolymers, which are the building blocks M-block or B-block of the block copolymers, are mixed together, they will not be soluble in the resin and will phase separate out prematurely.

The impact modifier (b) comprises one or more block copolymers having at least one block composed of methyl methacrylate. S-B-M triblocks are, in particular, constituted of polystyrene (PS), 1,4-polybutadiene (PB) and poly(methylmethacrylate) (PMMA), being preferably syndiotactic, whereas M-B-M-triblocks are symmetric block copolymers constituted of a center block of a poly(butylacrylate) or a diene and two side blocks of poly(methylmethacrylate) (PMMA).

Concerning the S-B-M triblock, M is preferably composed of methyl methacrylate monomers or comprises at least 50% by weight of methyl methacrylate, preferably at least 75% by weight of methyl methacrylate. The other monomers constituting the M block can be acrylic or non-acrylic monomers and may or may not be reactive. The term "reactive monomer" is understood to mean: a chemical group capable of reacting with the functional groups of the compound, or with the chemical groups of the acrylate-containing compound or with the chemical groups of the hardeners. Mention may be made, as non-limiting examples of reactive functional groups, of: oxirane functional groups, oxetane functional groups, (meth)acrylate functional groups, hydroxyl functional groups, amine functional groups or carboxyl functional groups. The reactive monomer can be (meth)acrylic acid or any other hydrolysable monomer resulting in these acids. Among the other monomers which can constitute the M block, are for example, glycidyl methacrylate or tert-butyl methacrylate. M is advantageously composed of syndiotactic PMMA to at least 60%. The M block and the S block of the S-B-M triblock can be identical or different. In case S and M are identical, it is MBM.

The Tg of B is advantageously less than 0° C. and preferably less than −40° C.

The monomer used to synthesize the elastomeric B block can be a diene chosen from butadiene, isoprene, 2,3-dimethyl-1,3-butadiene, 1,3-pentadiene or 2-phenyl-1,3-butadiene. B is advantageously chosen from poly(dienes), in particular poly(butadiene), poly(isoprene) and their random copolymers, or from partially or completely hydrogenated poly(dienes). Use is advantageously made, among polybutadienes, of those with the lowest Tg, for example 1,4-polybutadiene with a Tg (approximately −90° C.) lower than that of 1,2-polybutadiene (approximately 0° C.). The B blocks can also be hydrogenated. This hydrogenation is carried out according to the usual techniques.

The monomer used to synthesize the elastomeric B block can also be an alkyl (meth)acrylate. The following Tg values (between brackets following the name of the acrylate) are obtained: ethyl acrylate (−24° C.), butyl acrylate (−54° C.), 2-ethylhexyl acrylate (−85° C.), hydroxyethyl acrylate (−15° C.) and 2-ethylhexyl methacrylate (−10° C.). Butyl acrylate is advantageously used. The acrylates are different from those in the M block in order to observe the condition that B and M are incompatible and generate microscopic phase separation in the formulated resin, wherein the meaning of the term incompatible is as defined above.

The B blocks are preferably predominantly composed of 1,4-polybutadiene.

The B blocks of the S-B-M triblock can be identical or different, that means also blocks of different B members can be present.

The Tg of S is advantageously greater than 23° C. and preferably greater than 50° C. Mention may be made, as examples of S blocks, of those which derive from vinylaromatic compounds, such as styrene, α-methylstyrene or vinyltoluene, and those which derive from alkyl esters of acrylic acid and/or methacrylic acid having from 1 to 18 carbon atoms in the alkyl chain. In the latter case, the acrylates are different from those of the M block, in order to observe the condition that S and M are incompatible with B, wherein the meaning of the term incompatible is as defined above.

The S-B-M triblock has a number-average molecular weight Mn which can be between 10,000 g/mol and 500,000 g/mol, preferably between 20,000 and 200,000 g/mol. The S-B-M triblock advantageously has the following composition, expressed as fraction by mass, of the total being 100%: M: between 10 and 80% and preferably between 10 and 70%, B: between 2 and 80% and preferably between 5 and 70%, S: between 10 and 88% and preferably between 15 and 85%.

Nanostrength® E20, Nanostrength® E21 and Nanostrength® E 40, Nanostrength® A123, Nanostrength®A250 and Nanostrength®A012 products are representative of triblock copolymers of the S-B-M type obtainable from the company Arkema, France.

In the M-B-M triblock, M is composed of methyl methacrylate monomers or comprises at least 50% by weight of methyl methacrylate, preferably at least 75% by weight of methyl methacrylate. The other monomers constituting the M block can be acrylic or non-acrylic monomers and may or may not be reactive. The term "reactive monomer" is understood to mean: a chemical group capable of reacting with the functional groups of the cationic compound or with the chemical groups of the acrylate-containing compound or with the chemical groups of the matrix. Mention may be made, as non-limiting examples of reactive functional groups, of: oxirane functional groups, oxetane functional groups, (meth) acrylate functional groups, hydroxyl functional groups, amine functional groups or carboxyl functional groups. The reactive monomer can be (meth)acrylic acid or any other hydrolysable monomer resulting in these acids. Mention may be made among the other monomers which can constitute the M-block, as non-limiting examples, of glycidyl methacrylate or tert.-butyl methacrylate. M is advantageously composed of syndiotactic PMMA to at least 60%. The two M-blocks of the M-B-M triblock can be identical or different. They can also be different in their molar mass but composed of the same monomers.

The Tg of B is advantageously less than 0° C. and preferably less than −40° C.

The monomer used to synthesize the elastomeric B block can be a diene chosen from butadiene, isoprene, 2,3-dimethyl-1,3-butadiene, 1,3-pentadiene or 2-phenyl-1,3-butadiene. B is advantageously chosen form poly(dienes), in particular poly(butadiene), poly(isoprene) and their random copolymers, or from partially or completely hydrogenated poly(dienes). Use is advantageously made, among polybutadiene, of those with the lowest Tg, for example 1,4-polybutadiene with a Tg (approximately −90° C.) lower than that of 1,2-polybutadiene (approximately 0° C.). The B blocks can also be hydrogenated. The hydrogenation is carried out according to the usual techniques.

The monomer used to synthesize the elastomeric B block can also be an alkyl(meth)acrylate. The following Tg values (between brackets following the name of the acrylate) are obtained: ethyl acrylate (−24° C.), butyl acrylate (−54° C.), 2-ethylhexylacrylate (−85° C.), hydroxyethylacrylate(−15° C.) and 2-ethylhexyl methacrylate (−10° C.). The acrylates are different form those in the M block in order to observe the condition that B and M are incompatible with formation of microscopic phase separation.

The M-B-M-triblock has a number-average molecular weight Mn which can be between 10000 g/mol and 500000 g/mol, preferably between 20000 and 200000 g/mol. The M-B-M-triblock advantageously has the following compositions with regard to M and B, expressed as fraction by mass, the total being 100%. M between 10 and 80% and preferably between 15% and 70%. B between 90% and 20% and preferably between 85% and 30%.

When butyl acrylate is specifically selected from the alkyl (meth)acrylate family, the block copolymer is called MAM.

The designation Nanostrength M 22 represents a triblock copolymer of the M-A-M type obtainable from the company Arkema, France.

The block copolymers used in the materials of the present invention can be manufactured by anionic polymerization known to person skilled in the art.

According to a preferred form of the invention, the impact modifier comprises at least one S-B-M- or M-B-M-block copolymer and optionally, at least, one polymer or copolymer chosen from functionalized elastomers, S-B block copolymers, homopolymers made of B-, S- and/or A-block, ATBN (Amine Terminated Butadiene Acrylonitrile Copolymer) and CTBN (Carboxyl Terminated Butadiene Acrylonitrile) reactive rubbers, or any polymer, copolymer or surfactant compatible with the unit composing the S-B-M or M-A-M copolymer.

Preferably in the S-B diblock, the S and B blocks are composed of the same monomers and optionally comonomers as mentioned above for the S blocks and the B blocks of the S-B-M triblock. The S and B blocks of the S-B diblocks can be identical to or different from the S and B blocks present in the S-B-M block copolymers. The S-B diblocks are miscible with the S-B-M impact modifier and separate out the matrix together with the S-B-M impact modifier.

The S-B diblock has a number-average molecular weight Mn mass which can be between 500 g/mol and 25,000 g/mol, preferably between 1,000 and 5,000 g/mol.

With regard to the B-, S- and/or A-homopolymer, it is compatible with the S-, B- and/or or A-block of the S-B-M or M-A-M triblock. By compatible, it is meant that the homopolymer is soluble in the block-co-polymers composition, and will phase separate out together with the block-co-polymers. The homopolymer can be reactive or non-reactive. The homopolymer can be identical to or different from the block present in the block copolymers, S-B-M or M-A-M, of the impact modifier.

The homopolymer has a number-average molecular weight which can range between 250 g/mol and 10,000 g/mol, preferably between 1,000 and 5,000 g/mol.

The homopolymer can be a mixture of compatible homopolymers and is present in the composition at 0.5 to 40% in the total composition per weight.

In case core-shell polymers are present in combination with the block copolymers, a suitable core-shell polymer may be composed (i) of 75 to 80 parts of a core comprising, in moles, at least 93% of butadiene, 5% of styrene and 0.5 to 1% of divinylbenzene and (ii) of 25 to 20 parts of two shells essentially of the same weight, the internal one made of polystyrene and the other, external, made of PMMA.

According to a second preferred form of the invention, the impact modifier comprises at least one S-B-M- or M-B-M- block copolymer and at least one B-homopolymer. The impact modifier advantageously comprises between 0.5 and 40% of B-homopolymer for 0.5 to 20% of S-B-M-triblock.

According to another preferred form of the invention, the impact modifier comprises at least one S-B-M block copolymer and at least one S-B block copolymer. The impact modifier advantageously comprises between 0.5 and 40% of S-B diblock for respectively from 5 to 20% of S-B-M triblock.

According to an advantageous form, a portion of the S-B-M can be replaced with an S-B diblock. This portion can be up to 70% by weight of the S-B-M.

According to another advantageous form, a portion of the S-B-M or M-B-M-triblock can be replaced with a B-homopolymer. This portion can be up to 70% by weight of the S-B-M-M-B-M-triblock.

It will not be departing from the invention to replace all or part of the S-B-M triblock with an M-S-B-S-M or M-B-S-B-M pentablock. They can be prepared by anionic polymerization, like the di- or triblocks mentioned above, but by using a difunctional initiator. The number-average molecular weight Mn of these pentablocks is within the same ranges as that of the S-B-M triblocks. The proportion of the two M blocks together or of the two B or S blocks together is within the same ranges as the proportions of S, B and M in the S-B-M triblock.

The impact modifier consisting essentially of a block copolymer having at least one block predominantly composed of methyl methacrylate, in particular the S-B-M-triblock or M-B-M-triblock impact modifier (b) is advantageously employed in the compositions according to the invention.

Additionally, the block copolymer can be linear, star-like, H-shaped or exhibit any other shape.

Component (b) is preferably used in amounts of 0.5 to 20% by weight, more preferably in amounts of 1 to 15% by weight and in particular in amounts 1.5 to 10% by weight, based on the total weight of the composition.

Polymerization Initiator (Component (c))

The curable resin composition of present invention comprises one or more polymerization initiators (component (c)). The polymerization initiators are preferably selected from cationic polymerization initiator and radical polymerization initiator.

The cationic polymerization initiator is preferably chosen from those commonly used to initiate cationic photopolymerization. Examples include onium salts with anions of weak nucleophilicity, e.g., halonium salts, iodosyl salts, sulfonium salts, sulfoxonium salts, or diazonium salts. Metallocene salts are also suitable as photoinitiators.

Examples of commercial cationic initiators include Cyracure® UVI-6974 and UVI-6976 (which are a mixture of S,S,S,S'-Tetraphenylthiobis(4,1-phenylene)disulfonium dihexafluoroantimonate and diphenyl(4-phenylthiophenyl) sulfonium hexafluoroantimonate), Cyracure® UVI-6970, UVI-6960, UVI-6990, UVI-6992 (DOW Corp.), CD1010, CD-1011, CD-1012 (Sartomer Corp.), Adeka Optomer SP150, SP-151, SP-170, SP-171 (Asahi Denka Kogyo Co., Ltd.), Irgacure® 261, CI-2481, CI-2624, CI-2639, CI2064 (Nippon Soda Co, Ltd.), and DTS-102, DTS-103, NAT-103, NDS-103, TPS-103, MDS-103, MPI-103, BBI-103 (Midori Chemical Co, Ltd.). Also preferred are salts of iodonium ions, such as Rhodorsil® 2074 (supplied by RHODIA company). Most preferred are UVI-6974, CD-1010, UVI-6976, UVI-6992, Adeka Optomer SP-170, SP-171, CD-1012, and MPI-103 and KI78 (hexafluoroantimony sulfonium salt from Adeka). Preferred is a mixture of S,S,S,S'-Tetraphenylthiobis (4,1-phenylene)disulfonium dihexafluoroantimonate and diphenyl(4-phenylthiophenyl)sulfonium hexafluoroantimonate. Also preferred is a mixture of S,S,S,S'-Tetraphenylthiobis(4,1-phenylene)disulfonium dihexafluorophosphate and diphenyl(4-phenylthiophenyl)sulfonium hexafluorophosphate The cationic photoinitiators can be used either individually or in combination of two or more. The cationic photoinitiator can comprise a PF6 salt. Most especially preferred are those photoinitiators which contain little [i.e. less than 0.1%] or zero antimony.

The cationic polymerization initiator may be present in an amount from about 0.01-15%, preferably 0.1 to 10% by weight and in particular 0.5 to 10% by weight, based on the total weight of the composition of present invention.

The free radical photoinitiator may be chosen from those commonly used to initiate radical photopolymerization. Examples of free radical photoinitiators include benzoins, e.g., benzoin, benzoin ethers such as benzoin methyl ether, benzoin ethyl ether, benzoin isopropyl ether, benzoin phenyl ether, and benzoin acetate; acetophenones, e.g., acetophenone, 2,2-dimethoxyacetophenone, acetophenone, and 1,1-dichloroacetophenone; benzil ketals, e.g., benzil dimethylketal and benzil diethyl ketal; anthraquinones, e.g., 2-methylanthraquinone, 2-ethylanthraquinone, 2-tert-butylanthraquinone, 1-chloroanthraquinone and 2-amylanthraquinone; triphenylphosphine; benzoylphosphine oxides, e.g., 2,4,6-trimethylbenzoy-diphenylphosphine oxide (Luzirin TPO); bisacyiphosphine oxides; benzophenones, e.g., benzophenone and 4,4'-bis(N,N'-dimethylamino)benzophenone; thioxanthones and xanthones; acridine derivatives; phenazine derivatives; quinoxaline derivatives; 1-phenyl-1,2-propanedione 2-O-benzoyl oxime; 4-(2-hydroxyethoxy)phenyl-(2-propyl)ketone (Irgacure® 2959); 1-aminophenyl ketones or 1-hydroxy phenyl ketones, e.g., 1-hydroxycyclohexyl phenyl ketone, 2-hydroxyisopropyl phenyl ketone, phenyl 1-hydroxyisopropyl ketone, and 4-isopropylphenyl 1-hydroxyisopropyl ketone.

Preferably, the free radical photoinitiator is a cyclohexyl phenyl ketone. More preferably, the cyclohexyl phenyl ketone is a 1-hydroxy phenyl ketone. Most preferably the 1-hydroxy phenyl ketone is 1-hydroxycyclohexyl phenyl ketone, e.g., Irgacure® 184.

The free radical photoinitiator is preferably present in an amount of 0.01-10% by weight, based on the total weight of the composition of present invention.

In case a mixture of cationic and radical photoinitiator is used, the amounts of each polymerization initiator should be carefully adjusted in weight ratio to provide the required kinetics of curing to enable the required toughening phase separation to occur. Preferably the ratio of cationic to radical photoinitiator is: from 5:0 to 1:1, more preferably 3:1 to 1.5:1.

Further Components
Acrylate-Containing Compound (d)

The composition of the present invention can further comprise a component (d) a radically curable compound, preferably a (meth)acrylate, in particular selected from monomeric or oligomeric aliphatic, cycloaliphatic, or aromatic (meth)acrylate compounds having 2 to 20, preferably 2 to 17 and most preferably 2 to 6 acrylic groups. "(Meth)acrylate" refers to an acrylate, a methacrylate, or a mixture thereof. Further, the (meth)acrylate compound of component (d) may contain one or more hydroxyl group, such component is counted as acrylate component (d).

The acrylate-containing compound may include at least one polyfunctional (meth)acrylate, preferably a di-, tri-, tetra-, penta or hexafunctional monomeric or oligomeric aliphatic, cycloaliphatic, or aromatic (meth)acrylate. Monoacrylates may also be employed alone or together with the polyfunctional acrylates.

In one embodiment, the radically curable compound is a difunctional (meth)acrylate, for example, an aliphatic or aromatic difunctional (meth)acrylate. Examples of di(meth)acrylates include di(meth)acrylates of cycloaliphatic or aromatic diols such as tri-cyclodecane dimethanol, 1,4-dihydroxymethylcyclohexane, 2,2-bis(4-hydroxycyclohexyl)propane, bis(4-hydroxycyclohexyl)methane, hydroquinone, 4,4'-dihydroxybiphenyl, Bisphenol A, Bisphenol F, Bisphenol S, ethoxylated or propoxylated Bisphenol A, ethoxylated or propoxylated Bisphenol F, and ethoxylated or propoxylated Bisphenol S. Di(meth)acrylates of this kind are known and some are commercially available, e.g., Ebecryl® 3700 (Bisphenol-A epoxy diacrylate) (supplied by UCB Surface Specialties) A particularly preferred di(meth)acrylate is a Bisphenol A-based epoxy diacrylate. In a highly preferred embodiment component (d) is a poly(meth)acrylate of cyclic aliphatic compounds.

Alternatively, preferred di(meth)acrylates are acyclic aliphatic, hydrogenated aromatic or perhydrogenated aromatic (meth)acrylates. The meaning of hydrogenated or perhydrogenated aromatic is defined above. Di(meth)acrylates of this kind are generally known and include compounds of the following formulae

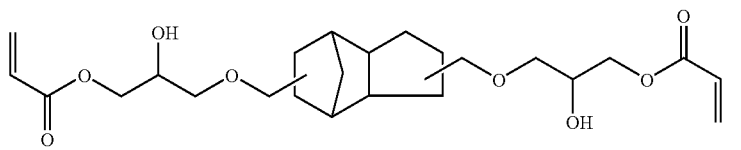

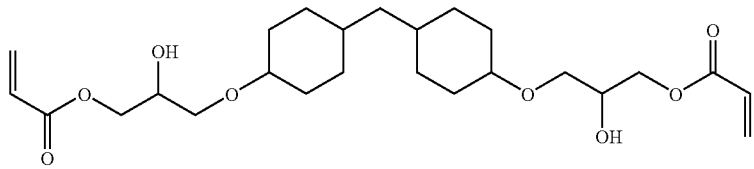

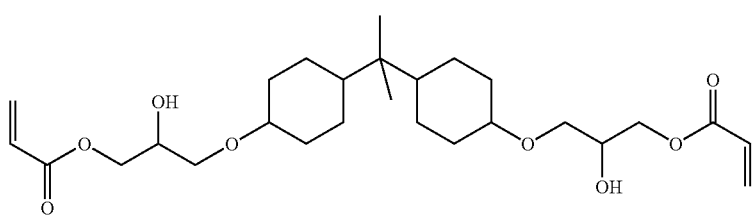

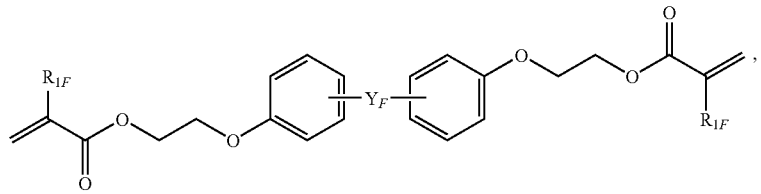

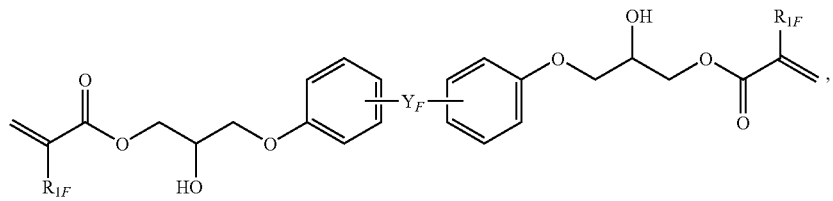

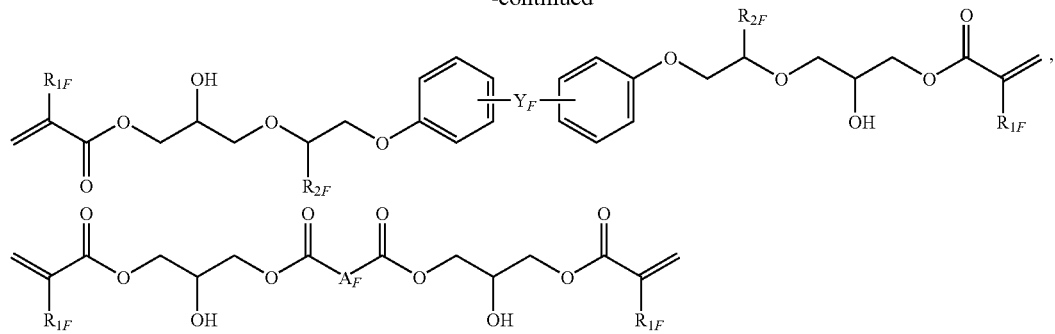

in which
(a) $R_{1F}$ is a hydrogen atom or methyl,
(b) $Y_F$ is a direct bond, $C_1$-$C_6$ alkylene, —S—, —O—, —SO—, —SO$_2$— or —CO—,
(c) $R_{2F}$ is a $C_1$-$C_8$ alkyl group, a phenyl group in which is unsubstituted or substituted by one or more $C_1$-$C_4$ alkyl groups, hydroxyl groups or halogen atoms, or is a radical of the formula —CH$_2$—OR$_{3F}$ in which
(d) $R_{3F}$ is a $C_1$-$C_8$ alkyl group or phenyl group, and
(e) $A_F$ is a radical selected from the radicals of the formulae Examples of suitable aromatic tri(meth)acrylates are the reaction products of triglycidyl ethers of trihydric phenols, and phenol or cresol novolaks containing three hydroxyl groups, with (meth)acrylic acid. Hydrogenated versions of these aromatic multi(metha)acrylates are also contemplated.

In certain circumstances, mono (meth)acrylic compound may be added to compositions to provide flexibility.

Preferably, the acrylate-containing compound includes a compound having at least one terminal and/or at least one pendant (i.e., internal) unsaturated group and at least one

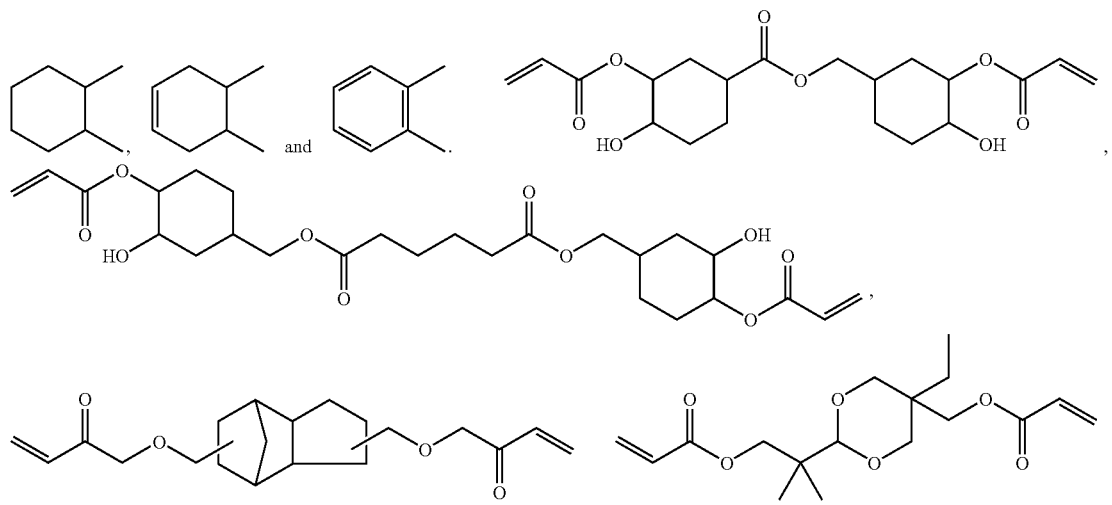

In a preferred embodiment the composition of present invention includes at least one polyfunctional (meth)acrylate (component (d)), more preferably selected from monomeric or oligomeric aliphatic, cycloaliphatic, or aromatic (meth)acrylate compounds having 2 to 20, preferably 2 to 17 and most preferably 2 to 6 acrylic groups. The polyfunctional (meth)acrylate preferably includes a tri(methyl)acrylate or a (meth)acrylate of higher functionality.

Examples are the tri(meth)acrylates of hexane-2,4,6-triol, glycerol, 1,1,1-trimethylolpropane, ethoxylated or propoxylated glycerol, and ethoxylated or propoxylated 1,1,1-trimethylolpropane. Other examples are the hydroxyl-containing tri(meth)acrylates obtained by reacting triepoxide compounds (e.g., the triglycidyl ethers of the trials listed above) with (meth)acrylic acid. Other examples are pentaerythritol tetraacrylate, bistrimethylolpropane tetraacrylate, pentaerythritol monohydroxytri(meth)acrylate, or especially dipentaerythritol monohydroxypenta(meth)acrylate.

terminal and/or at least one pendant hydroxyl group. The composition of the present invention may contain more than one such compound. Examples of such compounds include hydroxy mono(meth)acrylates, hydroxy poly(meth)acrylates, hydroxy monovinylethers, and hydroxy polyvinylethers. In a highly preferred embodiment component (d) is selected from poly(meth)acrylate derived from cyclic aliphatic compounds having two or more hydroxy groups. Commercially available examples include: dipentaerythritol pentaacrylate (SR 399, supplied by SARTOMER Company); pentaerythritol triacrylate (SR 444, supplied by SARTOMER Company), SR508 (dipropylene glycol diacrylate), SR 833s (tricyclodecane dimethanol diacrylate), SR9003 (dipropoxylated neopentyl glycol diacrylate), ethoxylated trimethylolpropane triacrylate (SR499, supplied by SARTOMER company) and bisphenol A diglycidyl ether diacrylate (Ebecryl® 3700, supplied by UCB Surface Specialties), SR 295 (pentaerythritol tetracrylate); SR 349 (triethoxylated bisphenol A diacrylate) SR 350 (trimethylolpropane trimethacrylate); SR 351 (trimethylolpropane triacrylate); SR 367 (Tetramethylolmethane tetramethacrylate); SR 368 (tris(2-acryloxy ethyl) isocyanurate triacrylate); SR 454 (ethoxylated (3) trimethylolpropane triacrylate); SR 9041 (dipentaerythritol pentaacrylate ester); and CN 120 (bisphenol A-epichlorohydrin diacrylate) (supplied by SARTOMER Company) and CN2301; CN2302; CN2303; CN 2304 (hyperbranched polyester acrylate).

Additional examples of commercially available acrylates include Kayarad® R-526 (hexanedioic acid, bis[2,2-dimethyl-3-[(1-oxo-2-propenyl) oxy]propyl]ester); Sartomer® 238 (hexamethylenediol diacrylate); SR 247 (neopentyl glycol diacrylate); SR 306 (tripropylene glycol diacrylate); Kayarad® R-551 (Bisphenol A polyethylene glycol diether diacrylate); Kayarad® R-712 (2,2'-Methylenebis[p-phenylenepoly(oxy-ethylene)oxy]diethyl diacrylate); Kayarad® R-604 (2-Propenoic acid, [2-[1,1-dimethyl-2-[(1-oxo-2-propenyl)oxy]ethyl]-5-ethyl-1,3-dioxan-5-yl]-methyl ester); Kayarad® R-684 (dimethyloltricyclodecane diacrylate); Kayarad® PET-30 (pentaerythritol triacrylate); GPO-303 (polyethylene glycol dimethacrylate); Kayarad® THE-330 (ethoxylated trimethylolpropane triacrylate); DPHA-2H, DPHA-2C and DPHA-21 (dipentaerythritol hexaacrylate); Kayarad® D-310 (DPHA); Kayarad® D-330 (DPHA); DPCA-20; DPCA-30; DPCA-60; DPCA-120; DN-0075; DN-2475; Kayarad® T-1420 (ditrimethylolpropane tetraacrylate); Kayarad® T-2020 (ditrimethyloipropane tetraacrylate); T-2040; TPA-320; TPA-330; Kayarad® RP-1040 (pentaerythritol ethoxylate tetraacrylate); R-011; R-300; R-205 (methacrylic acid, zinc salt, same as SR 634) (Nippon Kayaku Co., Ltd.); Aronix M-210; M-220; M-233; M-240; M-215; M-305; M-309; M-310; M-315; M-325; M-400; M-6200; M-6400 (Toagosei Chemical Industry Co, Ltd.); Light acrylate BP-4EA, BP-4PA, BP-2EA, BP-2PA, DCP-A (Kyoeisha Chemical Industry Co., Ltd.); New Frontier BPE-4, TEICA, BR-42M, GX-8345 (Daichi Kogyo Seiyaku Co., Ltd.); ASF-400 (Nippon Steel Chemical Co.); Ripoxy SP-1506, SP-1507, SP-1509, VR-77, SP-4010, SP-4060 (Showa Highpolymer Co., Ltd.); NK Ester A-BPE-4 (Shin-Nakamura Chemical Industry Co., Ltd.); SA-1002 (Mitsubishi Chemical Co., Ltd.); Viscoat-195, Viscoat-230, Viscoat-260, Viscoat-310, Viscoat-214HP, Viscoat-295, Viscoat-300, Viscoat-360, Viscoat-GPT, Viscoat-400, Viscoat-700, Viscoat-540, Viscoat-3000, Viscoat-3700 (Osaka Organic Chemical Industry Co., Ltd.).

Urethane acrylates are another class of preferred acrylates which may be used with the acrylic compounds described above: Mixed multifunctional compounds are also contemplated: such as glycidyl (meth)acrylate, tetrahydrofuranylmethylol (meth)acrylate, (3-ethyl-oxetylmethylol) (meth)acrylate, and glycidyl-polytetrahydrofuranylol and polyfunctional versions of these.

The curable resin composition of the present invention may include mixtures of the acrylate-containing compounds described above.

Preferably, the acrylate containing compound (d) is included from about 1 to 90% by weight, more preferably from about 1 to 70% by weight and most preferably from about 5 to 40% by weight, based on the total weight of the composition.

The curable resin composition according to present invention may further contain one or more stabilizer and other additives.

Polyol Compound (e)

The toughness and greenstrength of the products may be further improved by adding a polyol or a mixture of polyols as component (e). Further, it has been found that HDT can be retained.

The polyols may be present in an amount from 0.5 to 40% by weight, preferably from 1 to 25% by weight, based on the total weight of the curable composition, and are preferably made of such functionalities which do not react with the main resin mixture, or react only very slowly with the main resin mixture which is exemplified in this invention as the epoxy resin composition or matrix. Preferred polyols have a functionality of at least 2. Particularly preferred polyols have a functionality of 2 to 6, more preferably from 3 to 6.

The polyols may be selected form linear, cyclic or branched diols and polyols, glycols, glycerols. Suitable examples for diols and polyols with low molecular weight are diethylene glycol, 2,3-butanediol, pinacol, pentaerythritol, trimethylolopropane, alkoxylated diol and glycerol, polyalkylene glycols, polyether and polyester polyols. The molecular weight of the polyols is preferably between 150 and 6000 Da, preferably from 200 to 2000 Da.

Additional examples of polyols are polyols having a hydroxyl equivalent weight of about 70-7000 g/equivalent, preferably 80-1500 g/equivalent, which can be linear or branched poly(oxytetramethylene), poly(oxypropylene), poly(oxyethylene), hydroxy-terminated polybutadiene, hydroxy-terminated polysiloxane or a mixture thereof; and polyols having a hydroxyl equivalent weight of about 70-7000 g/equivalent, preferably 75-5000 g/equivalent, more preferably 80-1500 g/equivalent, which can be a polyether polyol, polyester polyol, polyurethane polyol or a mixture thereof.

In one embodiment, the polyol is a linear or branched poly(oxytetramethylene)diol. Linear or branched poly(oxytetramethylene)diols are generally known and prepared by the polymerization of tetrahydrofuran in the presence of Lewis acid catalysts such as boron trifluoride, tin (IV) chloride and sulfonyl chloride. The hydroxyl equivalent weight of the linear and branched poly(oxytetramethylene)diols ranges from at least 70 to 1500 g/equivalent, preferably from 75 to 1000 g/equivalent, more preferably from 80 to 800 g/equivalent, and most preferably is below 500. Commercially available poly(oxytetramethylene)diols include those available in the Polymeg® line (Penn Specialty Chemicals) and the poly-THF line from BASF. Commercially available hydroxy-terminated polybutadienes are PolyBD/R20LM and Krasol LDT2040 from Sartomer.

In another embodiment, the polyol is a polyether polyol having a hydroxyl equivalent weight of about 70-7000 g/equivalent, preferably about 80-1500 g/equivalent, and most preferably about 85-500 g/equivalent.

Examples of polyether polyols include various polyoxyalkylene polyols and mixtures thereof. The polyoxyalkylene polyols can be prepared, according to well-known methods, by condensing alkylene oxide, or a mixture of alkylene oxides using acid or base catalyzed addition, with a polyhydric initiator or a mixture of polyhydric initiators. Illustrative alkylene oxides include ethylene oxide, propylene oxide, butylene oxide, e.g., 1,2-butylene oxide, amylene oxide, aralkylene oxides, e.g., styrene oxide, and the halogenated alkylene oxides such as trichlorobutylene oxide and so forth. The more preferred alkylene oxides include butylene oxide, propylene oxide and ethylene oxide or a mixture thereof using random or step-wise oxyalkylation. Examples of such polyoxyalkylene polyols include polyoxyethylene, i.e., polyethylene triols, polyoxypropylene, i.e., polypropylene triols and polyoxybutylene, i.e., polybutylene triols. Commercially available polyoxyalkylene polyols include Arcol® LG650, Arcol® LHT-28, Arcol® LHT-42, Acclaim® 4200, Acclaim® 6300, Acclaim® 8200 and Acclaim® 12200 (all from Bayer Materials Science) and Lupranol® VP9272, Lupranol® VP9289 and Lupranol® VP9350 (all from Elastogran).

In another embodiment, the at least one other polyol is a polyester polyol. Polyester polyols which may be used include hydroxyl-terminated reaction products of polyhydric alcohols and polycarboxylic acids. Examples of polyester polyols suitable for use include Tone Polyol 0310 from Dow and Desmophen 5035BT from Bayer. A preferred polyol type is alkoxylated polyol esters, example being butoxylated trimethylolpropane (Simulsol TOMB ex Seppic). These types are not prone to humidity effects and so can result in especially water resistant cured products.

In yet another embodiment, the polyol is a polyurethane polyol. Polyurethane polyols can be prepared by means generally known, such as the reaction between isocyanates with one or more dials and/or trials.

Other Components

The resin composition of the present invention may also include other components, for example, stabilizers, modifiers, tougheners, antifoaming agents, leveling agents, thickening agents, flame retardants, antioxidants, antistatics, pigments, dyes, organic and inorganic fillers and nanofillers, liquid crystals, adhesion promoters, flow control agents, light stabilizers, fibers, sensitizers, electron donors and combinations thereof.

Stabilizers which may be added to the epoxy resin composition to prevent viscosity build-up during usage include butylated hydroxytoluene ("BHT"), 2,6-Di-tert-butyl-4-hydroxytoluene, hindered amines, e.g., benzyl dimethyl amine ("BDMA"), N,N-Dimethylbenzylamine, and boron complexes.

Preferred Embodiments

In one embodiment, the inventive curable composition comprises
(a) 5 to 97% by weight of the resin comprising monomers or oligomers or a mixture of monomers and oligomers polymerizable by a ring-opening reaction,
(b) 0.5 to 20% by weight of an impact modifier containing one or more block copolymers having at least one block composed of methyl methacrylate and
(c) 0.01 to 15% by weight of one or more polymerization initiators.

In another embodiment, the inventive curable composition comprises
(a) 5 to 97% by weight of the resin comprising monomers or oligomers or a mixture of monomers and oligomers polymerizable by a ring-opening reaction;
(b) 0.5 to 20% by weight of an impact modifier containing one or more block copolymers having at least one block composed of methyl methacrylate,
(c) 0.01 to 15% by weight of one or more polymerization initiators and
(d) 1 to 90% by weight of a polymerizable (meth)acrylate component, preferably a polymerizable polyfunctional (meth)acrylate component In further embodiment, the inventive curable composition comprises
(a) 15 to 85% by weight of the resin being liquid at 23° C. and comprising monomers or oligomers or a mixture of monomers and oligomers polymerizable by a ring-opening reaction;
(b) 1 to 15% by weight of an impact modifier containing one or more block copolymers having at least one block composed of methyl methacrylate and
(c) 0.01 to 15% by weight of one or more polymerization initiators and
(d) 1 to 70% by weight of polymerizable polyfunctional (meth)acrylate component;

In a further embodiment the curable composition comprises
(a) 30 to 70% by weight of the resin being liquid at 23° C. and comprising monomers or oligomers or a mixture of monomers and oligomers polymerizable by a ring-opening reaction;
(b) 1.5 to 10% by weight of an impact modifier containing one or more block copolymers having at least one block composed of methyl methacrylate and
(c) 0.5 to 10% by weight of a one or more polymerization initiators and
(d) 5 to 40% by weight of a polymerizable (meth)acrylate component.

In another embodiment, the inventive curable composition comprises
(a) 5 to 97% by weight of the resin comprising monomers or oligomers or a mixture of monomers and oligomers polymerizable by a ring-opening reaction;
(b) 0.5 to 20% by weight of an impact modifier containing one or more block copolymers having at least one block composed of methyl methacrylate,
(c) 0.01 to 15% by weight of one or more polymerization initiators and
(d) 1 to 25% by weight of a polyol or a polyol containing mixture, preferably a polyol or polyol mixture comprising a backbone of poly(oxytetramethylene)diol, particularly having a molecular weight between 200 and 4000 Da.

In another embodiment, the inventive curable composition comprises
(a) 5 to 97% by weight of the resin comprising monomers and/or oligomers and a mixture of monomers and oligomers polymerizable by a ring-opening reaction;
(b) 0.5 to 20% by weight of an impact modifier containing one or more block copolymers having at least one block composed of methyl methacrylate,
(c) 0.01 to 15% by weight of one or more cationic polymerization initiators
(d) 5 to 40% by weight of a polymerizable (meth)acrylate component and
(e) 1 to 25% by weight of a polyol or a polyol containing mixture, preferably a polyol or polyol mixture comprising a backbone of poly(oxytetramethylene)diol, particularly having a molecular weight between 200 and 4000 Da.

All our examples are made up to 100%. As it is clear for those skilled in the art, the examples show how the various distribution of the components in all above embodiments and are utilized to make up a composition of 100% in total.

Further Embodiments

The compositions of the invention can be prepared by carrying out the following steps:
(A) heating the resin composition of component (a) to a temperature above 23° C., (B) adding the impact modifier (b) and (C) cooling down the obtained mixture and adding the polymerization initiator(s) and additives such as polyfunctional (meth)acrylate.

The temperature in step A should be high enough that the impact modifier (b) dissolves in the curable resin and that the mixture of (a) and (b) give a clear solution, preferably the temperature is above 50° C., preferably above 80° C. In order to accelerate the dissolution of (b) in (a), the mixture can be stirred. In step (C) the optional components are added preferably under stirring as well without any limitation to the sequence of adding the components.

Alternatively, the composition of present invention can be prepared by either blending the resin (a) and the polyfunctional (meth)acrylate followed by adding the impact modifier (b) or blending the impact modifier (b) first with the polyfunctional (meth)acrylate and then with the epoxy resin (a).

The compositions according to the invention can be employed quite generally for the production of cured products and can be used in the formulation suitable for the particular specific field of use, for example as curable resins for rapid prototyping or rapid manufacture, 3D inkjet printing, coating compositions for example in optical fibres, paints, pressing compositions, moulding composition, dipping resins, casting resins, impregnating resins, laminating resins, hotmelt, 1- or 2-component adhesives or matrix resins. The composition can also be used in the field of aerospace, automotive, wind mill and sports equipment as photocurable laminating resins, hotmelt, composition for the Resin-Transfer-Moulding process, 1- or 2-component adhesives or matrix resins are also possible.

A further embodiment of present invention is a process comprising the steps of a. applying a layer of the curable composition of claim 1 onto a surface;

b. exposing the layer imagewise to actinic radiation to form an imaged cured cross-section, c. applying a second layer of the composition of claim 1 onto the previously exposed imaged cross-section;

d. exposing the layer from step (c) imagewise to actinic radiation to form an additional imaged cured cross-section, causes curing of the second layer in the exposed areas and adhesion to the previously exposed cross-section; and e. repeating steps (c) and (d) a number of times in order to build up a three-dimensional article.

Still a further embodiment is a three-dimensional article produced by the process described above.

EXAMPLES

Unless stated otherwise, "%" is "% by weight" and "part" is "part by weight".

Testing Procedures

SL Technology

The photosensitivity of the compositions is determined on so-called window panes. In this determination, single-layer test specimens are produced using different laser energies, and the layer thicknesses are measured. The plotting of the resulting layer thickness on a graph against the logarithm of the irradiation energy used gives the "working curve". The slope of this curve is termed Dp (Depth of Penetration, in mils (1 mil=25.4 mm)). The energy value at which the curve passes through the x-axis is termed Ec (Critical Energy, in mJ/cm2). Cf. P. Jacobs, Rapid Prototyping and Manufacturing, Soc. Of Manufacturing Engineers, 1992, pp 270 ff.). For each example described, the inventors have chosen to report the energy required to fully polymerize a 0.10 mm layer, E4, in mJ/cm2.

Mechanical and thermal properties are determined on parts fabricated on SLA 7000 (a StereoLithography Apparatus supplied by 3D Systems, equipped with a solid-state laser).

The green strength is determined by measuring the flexural modulus at 10 minutes and 1 hour after the part was produced using the machine, without any additional curing.

3D Printing Technology

For 3D printing application, samples were prepared in a silicon mold and cured using a U.V. lamp. A fluid viscosity for such application of below 30 mPa·s is needed, with a preferred viscosity range of 8 to 20 mPa·s at 70° C. (e.g.: Spectra Nova PH256/80AA printhead). However, future technology will allow jetting of a more viscous fluid, at even higher temperature.

Mechanical Testing

Mechanical testing of fully cured parts was done according to ISO standards. Parts have been conditioned 3-5 days at 23° C. and 50% Room Humidity prior to testing.

|  | ISO standard |
|---|---|
| Tensile properties<br>elongation to break, strength, modulus | 527 |
| Flexural properties<br>Maximum strength, modulus | 178 |
| Bend Notched Impact Resistance<br>Fracture toughness (G1C), stress intensity coefficient (K1C) | 13586 |
| HDT at 1.8 MPa<br>Heat deflection temperature under 1.80 MPa load | 75 |

Viscosity:

The viscosity is measured at 30° C. on Brookfield viscosimiters, models: LVTDVII, LVTDV III or RVT. The spindles used were numbers 18 and 21. For 3D printing application, the viscosity was measure at 65° C. using only spindle 18 on LVTDVIII.

The compounds used in the examples are listed in the following table 1:

TABLE 1

| Trade Name | Source | Chemical Name |
| --- | --- | --- |
| Uvacure 1500 | Cytec | 3,4 epoxycyclohexylmethyl 3',4'epoxycyclohexanecarboxylate |
| Erisys GE 30 | CVC Chemicals | Trimethylol propane triglycidyl ether |
| DER332 | Dow Chemicals | Bisphenol A diglycidyl ether |
| Epalloy 5000 | CVC Chemicals | Hydrogenated bisphenol A diglycidyl ether |
| OXT-101 | Toagosei | 3-ethyl-3hydroxymethyl oxetane-TMPO |
| OXT-221 | Toagosei | 3,7 bis-(3-oxetanyl)-5-oxanonane |
| SR833S | Sartomer Co. | Tricyclodecanedimethanol diacrylate |
| SR9003 | Sartomer Co. | Propoxylated$_2$ neopentyl glycol diacrylate |
| SR9035 | Sartomer Co. | Ethoxylated$_{15}$ trimethylolpropane triacrylate |
| SR 499 | Sartomer Co. | Ethoxylated$_6$ trimethylolpropane triacrylate |
| SR 495 | Sartomer Co. | Caprolactone acrylate |
| SR399 | Sartomer Co. | Dipentaerythrytol pentacrylate |
| SR348 | Sartomer Co. | Ethoxylated$_2$ bisphenol A dimethacrylate |
| SR349 | Sartomer Co. | Ethoxylated$_3$ bisphenol A diacrylate |
| CN2301 | Sartomer Co. | Hyperbranched polyester acrylate oligomer |
| Ebecryl KB8402 | UCB | Aliphatic Urethane diacrylate |
| UVI6976 | Dow Chemicals Company | Mixture of PhS—($C_6H_4$)—$S^+Ph_2SbF_6^-$ and $Ph_2S^+$—($C_6H_4$)S($C_6H_4$)—$S^+Ph_2$—$(SbF_6^-)_2$ |
| UVI6992 | Dow Chemicals Company | Mixture of PhS—($C_6H_4$)—$S^+$—$Ph_2PF_6^-$ and $Ph_2S^+$—($C_6H_4$)—S—($C_6H_4$)—$S^+Ph_2(PF_6^-)_2$ |
| Esacure 1064 | Lamberti | Mixture of PhS—($C_6H_4$)—$S^+$—$Ph_2PF_6^-$ and $Ph_2S^+$—($C_6H_4$)—S—($C_6H_4$)—$S^+Ph_2(PF_6^-)_2$ |
| Irgacure 184 | Ciba Specialty Chemicals | 1-hydroxycyclohexyl phenyl ketone |
| Irgacure 651 | Ciba Specialty Chemicals | α,α-dimethoxy-α-phenyl acetophenone |
| Lucirin TPO | BASF | Acylphosphinoxide |
| Nanostrength SBM Powder AFX E21 | Arkema | Block copolymer: Polystyrene-polybutadiene-polymethylmethacrylate |
| Nanostrength MAM M22 | Arkema | Block copolymer: Polymethylmethacrylate-poly(butyl acrylate)-polymethylmethacrylate |

Polyols Components ( ) Used in the Examples:

| Trade Name | Source | Chemical Name | Molecular Weight (Da) | Functionality |
| --- | --- | --- | --- | --- |
| Arcol Polyol LG650 | Bayer | Propoxylated glycerol | 260 | 3 |
| Terathane 250 | Invista | polytetrahydrofurane | 230-270 | 2 |
| Terathane 650 | Invista | polytetrahydrofurane | 625-675 | 2 |
| PTHF 1000 | BASF | polytetrahydrofurane | 950-1050 | 2 |
| Terathane 2000 | Invista | polytetrahydrofurane | 1950-2050 | 2 |
| Terathane 2900 | Invista | polytetrahydrofurane | 2800-3000 | 2 |
| Poly G20-265 | Arch | Polypropylene glycol diol | 425 | 2 |
| Poly G30-280 | Arch | Polypropylene glycol triol | 600 | 3 |
| Poly G20-56 | Arch | Polypropylene glycol diol | 2000 | 2 |
| Acclaim 4200 | Bayer Polymers | Polyether polyol based on propylene oxide | 4000 | 2 |
| Acclaim 12200 | Bayer Polymers | Polyether polyol based on propylene oxide | 11200 | 2 |
| Simulsol TOMB | Seppic | Butoxylated trimethylolpropane | 650 | 3 |
| CHDM | Sigma-Aldrich | Cyclohexane dimethanol | 144 | 2 |

Impact Modifier Used in the Examples

| Trade Name | Source | Chemical Name |
|---|---|---|
| Nanostrength SBM Powder AFX E21 | Arkema | Block copolymer: Polystyrene-polybutadiene-polymethylmethacrylate |
| Nanostrength MAM M22 | Arkema | Block copolymer: Polymethylmethacrylate-poly(butyl acrylate)-polymethylmethacrylate |

Step 1): Preparation of Masterbatches of Block Copolymers in eg. Epoxies

Process A

The epoxy resin is heated at 50° C., under stirring, inside a five neck reactor equipped with a thermometer, a condenser, a mechanical stirrer, a $N_2$ gas inlet and a stopper. When the temperature is reached, a selected amount of block copolymers is added stepwise, under continuous $N_2$ flow, before the temperature is risen to 100-110° C. Stirring is maintained during 1-1.50 hours at 100-110° C. Afterwards, the oil bath is removed, and the mixture is cooled down to 40° C. under continuous $N_2$ flow and stirring conditions. Finally, the mixture is poured into a more handable container.

Process B

If the premix is made at room temperature, the dissolution of the block copolymer requires stirring for an extended length of time. A selected amount of block copolymers granules is added to the previously weighted epoxy resin. Strong stirring is applied to the premix and maintained for 2 hours. Interruption of the stirring allows that undissolved granules to separate at the surface of the mixture. Stirring is resumed for another 6 hours. This additional stirring at RT does not allow full solubilisation of the granules. The final mixture is not homogeneous in viscosity.

Table 2 describes example masterbatch formulations and their viscosities:

TABLE 2

| | Ex. 1 | Ex. 2 | Ex. 3 | Ex. 4 |
|---|---|---|---|---|
| Process used | B | A | A | A |
| Uvacure 1500 | 90% | 90% | 90% | |
| Epalloy 5000 | | | | 87.35% |
| Nanostrength M22 | | | 10% | 12.65% |
| Nanostrength AFX E21 | 10% | 10% | | |
| Viscosity (30° C.) | 7480 mPa·s | 7210 mPa·s | 3410 mPa·s | >10000 mPa·s |

Step 2) Preparation of Formulations

The formulations indicated in the following table 3 are prepared by mixing the components with a masterbatch of block copolymer prepared as described in STEP 1), with a stirrer at 20° C., until a homogeneous composition is obtained.

Step 3) Examples of Application in Stereolithography

Examples 5-7

| | Ex. 5 Comparative | Ex. 6 | Ex. 7 |
|---|---|---|---|
| Uvacure 1500 | 69.04 | 64.56 | 68.78 |
| Erisys Ge30 | 12.83 | 12 | 12.78 |
| Epoxy | 81.87 | 76.56 | 81.56 |
| SR 399 | 2.24 | 2.1 | 1.05 |
| SR 495 | 8.45 | 7.9 | 3.95 |
| Acrylate | 10.69 | 10 | 5 |
| Polymerization Initiators | | | |
| Irgacure 184 | 2.13 | 2.13 | 2.13 |
| UVI 6976 | 5.31 | 5.31 | 5.31 |
| Copolymer | | | |
| Nanostrength SBM AFX E21 | | 6 | 6 |
| η 30° C. (mPa·s) | 147 | 495 | 595 |
| E4 (mJ/cm2) | not measurable | 80.6 | 53.7 |
| Tensile modulus (MPa) | — | 2735 | — |
| Elongation at break (%) | — | 1.08 | — |
| Bend Modulus (MPa) | — | 2618 | — |
| GFM -10 min (MPa) | — | 214 | — |
| GFM - 60 min (mPa) | — | 402 | — |
| K1C (MPa·$M^{1/2}$) | — | 1.03 | — |
| G1C (J/$m^2$) | — | 340 | — |
| HDT at 1.8 MPa (° C.) | — | 58.4 | — |

Examples 8 and 9

| | Ex. 8 Comparative | Ex. 9 |
|---|---|---|
| Uvacure 1500 | 9.52 | 8.57 |
| Epoxy | 9.52 | 8.57 |
| Ebecryl KB 8402 | 25.59 | 25.59 |
| SR348 | 30.87 | 30.87 |
| SR349 | 17.63 | 17.63 |
| SR9035 | 9.27 | 9.27 |
| Acrylate | 83.36 | 83.36 |
| Polymerization Initiators | | |
| Irgacure 651 | 1.29 | 1.29 |
| UVI 6976 | 4.76 | 4.76 |
| Lucirin TPO | 1.07 | 1.07 |
| Copolymer | | |
| Nanostrength SBM AFX E21 | | 0.95 |
| η 30° C. (mPa·s) | 858 | 1190 |
| E4 (mJ/cm2) | 19.4 | 22.2 |
| Tensile modulus (MPa) | 656 | 705 |
| Elongation at break (%) | 5.66 | 7.06 |
| Bend Modulus (MPa) | 689 | 773 |
| GFM -10 min (MPa) | 178 | 184 |
| GFM -60 min (MPa) | 188 | 213 |
| K1C (MPa·$m^{1/2}$) | 0.58 | 0.66 |
| G1C (J/$m^2$) | 418 | 480 |
| HDT at 1.8 MPa (° C.) | 38 | 37.3 |

The presence of as low as 0.95% of SBM in Ex. 9 provides an overall improvement in the balance of mechanical properties as compared to comparative Ex. 8 without a significant loss of temperature resistance

Examples 10-26

| | Comparative Ex. 10 | Ex. 11 | Ex. 12 | Ex. 13 | Ex. 14 | Ex. 15 | Ex. 16 | EX. 17 |
|---|---|---|---|---|---|---|---|---|
| Uvacure 1500 | 52 | 51.49 | 50.84 | 49.71 | 49.48 | 48.69 | 47.49 | 48.9 |
| DER332 | 5 | 4.95 | 4.89 | 4.78 | 4.76 | 4.68 | 4.57 | 2.9 |
| Epoxy | 57 | 56.44 | 55.73 | 54.49 | 54.26 | 53.37 | 52.06 | 51.8 |
| SR 399 | 3 | 2.97 | 2.93 | 2.87 | 2.85 | 2.81 | 2.74 | 2.9 |
| SR 499 | 15 | 14.85 | 14.66 | 14.34 | 14.27 | 14.04 | 13.7 | 14.0 |
| Acrylate % | 14 | 17.82 | 17.59 | 17. | 17.12 | 16.85 | 15.81 | 16.9 |
| Arcol LG 650 | 20 | 19.80 | 19.55 | 19.12 | 19.03 | 18.73 | 18.26 | 18.8 |
| Polyol | 20 | 19.80 | 19.55 | 19.12 | 19.03 | 18.73 | 18.26 | 18.8 |
| Polymerization Initiators | | | | | | | | |
| Irgacure 184 | 2 | 1.98 | 1.96 | 1.91 | 1.90 | 1.87 | 1.83 | 1.8 |
| UVI6992 | | | | | | | | 5.8 |
| UVI6976 | 3 | 2.97 | 2.93 | 2.87 | 2.85 | 2.81 | 2.74 | |
| Copolymer | | | | | | | | |
| MAM Nanostrength M22 | | | | | | | | 4.9 |
| Nanostrength SBM AFX E21 | | 0.99 | 2.29 | 4.6 | 5.09 | 6.80 | 9.5 | |

Properties of Parts Manufactured in SLA7000

| | Comparative Ex. 10 | Ex. 11 | Ex. 12 | Ex. 13 | Ex. 14 | Ex. 15 | Ex. 16 | EX. 17 |
|---|---|---|---|---|---|---|---|---|
| η 30° C. (mPa·s) | 170 | 185 | 205 | 300 | 329 | 458 | 730 | 648 |
| E4 (mJ/cm2) | 28.7 | 28.4 | — | — | 66.4 | 73.6 | 95.1 | 26.3 |
| Bend Modulus (MPa) | 2885 | 2963 | 3013 | 2954 | — | 2641 | 2318 | 2012 |
| GFM -10 min (MPa) | 664 | — | — | 1085 | — | — | — | 570 |
| GFM - 60 min (MPa) | 958 | — | — | 1260 | — | — | — | 695 |
| K1C (MPa·m$^{1/2}$) | 1.06 | 1.13 | 1.36 | 1.51 | 1.56 | 1.71 | 1.72 | 2.19 |
| G1C (J/m$^2$) | 331 | 363 | 518 | 652 | 770 | 929 | 1092 | 2017 |
| HDT at 1.8 MPa (° C.) | 49.2 | — | 48.8 | 46.6 | — | — | — | 43.1 |

| | Comparative Ex. 18 | Ex. 19 | Ex. 20 | Ex. 21 | Ex. 22 | Ex. 23 | Ex. 24 | Comparative Ex. 25 | Ex. 26 |
|---|---|---|---|---|---|---|---|---|---|
| Uvacure 1500 | 50.7 | 46.96 | 46.96 | 46.96 | 60.01 | 47.38 | 44.1 | | |
| DER332 | 4.87 | 4.9 | 4.9 | 4.9 | 5.77 | 4.56 | 4.24 | | |
| Epalloy 5000 | | | | | | | | 56.5 | 52.9 |
| OXT 101 | | | | | | | | 15 | 14 |
| Epoxy | 55.57 | 51.86 | 51.86 | 51.86 | 65.78 | 51.94 | 48.34 | 71.5 | 66.9 |
| SR 399 | 2.92 | 2.98 | 2.98 | 2.98 | 3.46 | 2.73 | 2.54 | 6 | 5.6 |
| SR 499 | 14.61 | 14.57 | 14.57 | 14.57 | 17.31 | 13.67 | 12.72 | | |
| SR9003 | | | | | | | | 6 | 5.6 |
| Acrylate | 17.53 | 17.55 | 17.55 | 17.55 | 20.77 | 17.40 | 15.26 | 12 | 11.2 |
| Arcol LG 650 | 19.49 | 19.47 | 19.47 | 19.47 | | 18.22 | 16.96 | | |
| CHDM | | | | | | | | 10 | 9.4 |
| Polyol | 19.45 | 19.47 | 19.47 | 19.47 | — | 18.22 | 16.96 | 10 | 9.4 |
| Polymerization Initiators | | | | | | | | | |
| Irgacure 184 | 2.13 | 2.13 | 2.13 | 2.13 | 2.13 | 2.13 | 2.13 | 1.5 | 1.5 |
| UVI6976 | 5.31 | 5.31 | 5.31 | 5.31 | 5.31 | 5.31 | 5.31 | 5 | 5 |
| Copolymer | | | | | | | | | |
| MAM Nanostrength M22 | | 3.68 | | | | | | | |
| Nanostrength SBM AFX E21 | | | 3.68 | 3.68 | 6 | 6 | 12 | | 6 |

* Example 20 was made using masterbatch Ex. 2 and Example 21 was made using masterbatch Ex. 1

Properties of Parts Manufactured in SLA7000

|  | Comparative Ex. 18 | Ex. 19 | Ex. 20 | Ex. 21 | Ex. 22 | Ex. 23 | Ex. 24 | Comparative Ex. 25 | Ex. 26 |
|---|---|---|---|---|---|---|---|---|---|
| η 30° C. (mPa · s) | 367 | 524 | 280 | 360 | 580 | 422 | 2840 | 274 | 460 |
| E4 (mJ/cm2) | 26.8 | 54.8 | 70.7 | 62.1 | 52.2 | 101.8 | 197.6 | 59.6 | 80.1 |
| Tensile modulus (MPa) | 2941 | 2605 | 2464 | 2751 | 2638 | 2719 | 2463 | 436 | 581 |
| Elongation at break (%) | 6.1 | 7.5 | 2.4 | 2.0 | 2.8 | 3.1 | 6.3 | 43.4 | 33 |
| Bend Modulus (MPa) | 2436 | 2223 | 2372 | 2634 | 2662 | 2555 | 2174 | 404 | 337 |
| GFM -10 min (MPa) | 1326 | 1523 | 1830 | 297 | 263 | 1762 | 1494 | 570 | 757 |
| GFM - 60 min (MPa) | 1601 | 1595 | 1829 | 587 | 478 | 1858 | 1716 | 729 | 1168 |
| K1C (MPa · m$^{1/2}$) | 0.8 | 2.54 | 1.63 | 1.05 | 1.07 | 2.18 | 2.53 | 1.02 | 1.28 |
| G1C (J/m$^2$) | 225 | 2463 | 942 | 352 | 364 | 1569 | 2523 | 2187 | 4102 |
| HDT at 1.8 MPa (° C.) | 49.8 | 49.2 | 47.4 | 58.4 | 59.3 | 50.3 | 48.2 | — | — |

The unforeseen increase in toughening providing an overall improved balance of properties, also surprisingly provides nicer parts with sharp edges and smoother sidewalls. This last aspect is very important and highly commercially useful when building layerwise three dimensional objects.

|  | Comparative Ex. 27 | Ex. 28 | Comparative Ex. 29 | Ex. 30 |
|---|---|---|---|---|
| Uvacure 1500 | 51 | 46.8 | 51.3 | 37.5 |
| OXT 101 | 45.9 | 45.9 | 45.5 | 56.0 |
| Epoxy | 96.9 | 92.7 | 96.8 | 93.5 |
| Polymerization Initiators |  |  |  |  |
| UVI6992 |  |  | 3.1 | 3.1 |
| UVI6976 | 3.1 | 3.1 |  |  |
| Copolymer |  |  |  |  |
| MAM Nanostrength M22 |  | 4.2 |  | 3.4 |
| η 30° C. (mPa · s) | 35.1 | 130 | 33.9 | 77.8 |
| η 65° C. (mPa · s) | 9.6 | 35.5 | 9.6 | 28.7 |
| Elongation at break (%) | 4.5 | 4.8 | 3.6 | 4.8 |
| Bend Modulus (MPa) | 2350 | 2578 | 1781 | 2540 |
| K1C (MPa · m$^{1/2}$) | 0.56 | 1.08 | 0.38 | 1.07 |
| G1C (J/m$^2$) | 115 | 384 | 70.6 | 383 |
| HDT at 1.8 MPa (° C.) | 65.3 | 62.4 | 49.3 | 52.3 |

Examples 31 to 33

Formulations with Difunctional Polytetrahydrofurane

|  | Ex. 31 Comparative | Ex. 32 | Ex. 33 |
|---|---|---|---|
| Epoxy |  |  |  |
| Uvacure 1500 | 66.43 | 46.96 | 46.96 |
| Tactix 123 | 4.9 | 4.9 | 4.9 |
| Acrylate |  |  |  |
| SR 399 | 2.98 | 2.98 | 2.98 |
| SR 499 | 14.57 | 14.57 | 14.57 |
| Polyols |  |  |  |
| Terathane 250 |  | 19.47 |  |
| Terathane 650 |  |  | 19.47 |
| PTHF1000 |  |  |  |
| Terathane 2000 |  |  |  |
| Terathane 2900 |  |  |  |
| Photoinitiators |  |  |  |
| Irgacure 184 | 2.13 | 2.13 | 2.13 |
| UVI 6976 | 5.31 | 5.31 | 5.31 |
| Copolymer |  |  |  |
| Nanostrength SBM AFX E21 | 3.68 | 3.68 | 3.68 |
| η 30° C. (mPa · s) | 300 | 158 | 253 |
| E4 (mJ/cm2) | 48.2 | 89.0 | 82.8 |
| Tensile modulus (MPa) | 848 | 1009 | 1379 |
| Elongation at break (%) | 1.6 | 19.7 | 21.4 |
| Bend Modulus (MPa) | 1141 | 1059 | 1238 |
| GFM -10 min (MPa) | 38.7 | 995.6 | 522.5 |
| K1C (MPa · m$^{1/2}$) | 0.71 | 1.59 | 1.47 |
| G1C (J/m$^2$) | 373 | 2031 | 1457 |
| HDT at 1.8 MPa (° C.) | 35.9 | 37.8 | 41.1 |
| Tensile modulus (MPa) - improvement compared to example 1 in % | 100 | 119 | 163 |
| Elongation at break (%) - improvement compared to example 1 in % | 100 | 1230 | 1337.5 |
| GFM -10 min (MPa) - improvement compared to example 1 in % | 100 | 2573 | 1350 |
| K1C (MPa · m$^{1/2}$) - improvement compared to example 1 in % | 100 | 223 | 206 |
| G1C (J/m$^2$) - improvement compared to example 1 in % | 100 | 544 | 391 |
| HDT at 1.8 MPa (° C.) - improvement compared to example 1 in % | 100 | 105 | 114 |

Examples 34 to 37

Formulations with Difunctional Polypropylene Oxide Polyol

|  | Ex. 31 Comparative | Ex. 34 | Ex. 35 | Ex. 36 | Ex. 37 |
|---|---|---|---|---|---|
| Epoxy | | | | | |
| Uvacure 1500 | 66.43 | 46.96 | 46.96 | 46.96 | 46.96 |
| Tactix 123 | 4.9 | 4.9 | 4.9 | 4.9 | 4.9 |
| Acrylate | | | | | |
| SR 399 | 2.98 | 2.98 | 2.98 | 2.98 | 2.98 |
| SR 499 | 14.57 | 14.57 | 14.57 | 14.57 | 14.57 |
| Polyols | | | | | |
| Poly G20-265 | | 19.47 | | | |
| Poly G20-56 | | | 19.47 | | |
| Acclaim 4200 | | | | 19.47 | |
| Acclaim 12200 | | | | | 19.47 |
| Photoinitiators | | | | | |
| Irgacure 184 | 2.13 | 2.13 | 2.13 | 2.13 | 2.13 |
| UVI 6976 | 5.31 | 5.31 | 5.31 | 5.31 | 5.31 |
| Copolymer | | | | | |
| Nanostrength SBM AFX E21 | 3.68 | 3.68 | 3.68 | 3.68 | 3.68 |
| $\eta$ 30° C. (mPa · s) | 300 | 175 | 305 | 510 | NA |
| E4 (mJ/cm2) | 48.2 | 108.5 | 80.7 | 52 | NA |
| Tensile modulus (MPa) | 848 | 1622 | 1166 | 1071 | NA |
| Elongation at break (%) | 1.6 | 14.9 | 12.6 | 7.9 | NA |
| Bend Modulus (MPa) | 1141 | 1395 | 1116 | 1021 | NA |
| GFM -10 min (MPa) | 38.7 | 674 | 185 | 103 | NA |
| K1C (MPa · m$^{1/2}$) | 0.71 | 1.74 | 0.92 | 0.66 | NA |
| G1C (J/m$^2$) | 373 | 1857 | 639 | 334 | NA |
| HDT at 1.8 MPa (° C.) | 35.9 | 40.6 | 40.7 | 43.3 | NA |

Examples 38 to 41

Formulations with Trifunctional Polyether Polyol

|  | Ex. 31 Comparative | Ex. 38 Comparative | Ex. 39 | Ex. 40 | Ex. 41 |
|---|---|---|---|---|---|
| Epoxy | | | | | |
| Uvacure 1500 | 66.43 | 50.64 | 46.96 | 46.96 | 48.77 |
| Tactix 123 | 4.9 | 4.9 | 4.9 | 4.9 | 4.9 |
| Acrylate | | | | | |
| SR 399 | 2.98 | 2.98 | 2.98 | 2.98 | 2.98 |
| SR 499 | 14.57 | 14.57 | 14.57 | 14.57 | 14.57 |
| Polyols | | | | | |
| Arcol LG650 | | 19.47 | 19.47 | | |
| Poly G20-380 | | | | 19.47 | |
| Simulsol TOMB | | | | | 19.47 |
| Photoinitiators | | | | | |
| Irgacure 184 | 2.13 | 2.13 | 2.13 | 2.13 | 2.13 |
| UVI 6976 | 5.31 | 5.31 | 5.31 | 5.31 | 3.5 |
| Copolymer | | | | | |
| Nanostrength SBM AFX E21 | 3.68 | | 3.68 | 3.68 | 3.68 |

| | | | | | |
|---|---|---|---|---|---|
| η 30° C. (mPa · s) | 300 | 145 | 250 | 210 | 290 |
| E4 (mJ/cm2) | 48.2 | 44.4 | 98.7 | 83.7 | 49.0 |
| Tensile modulus (MPa) | 848 | 3081 | 3025 | 2187 | 2658 |
| Elongation at break (%) | 1.6 | 5.4 | 7.3 | 11.2 | 11.7 |
| Bend Modulus (MPa) | 1141 | 2751 | 2886 | 1936 | 2213 |
| GFM-10 min (MPa) | 38.7 | 1243 | 1757 | 796 | |
| K1C (MPa · m$^{1/2}$) | 0.71 | 0.82 | 1.85 | 1.88 | 1.49 |
| G1C (J/m$^2$) | 373 | 204 | 1017 | 1571 | 836 |
| HDT at 1.8 MPa (° C.) | 35.9 | 49.6 | 50.9 | 45.1 | |

| | Ex. 31 comparative SBM - no polyol | Ex. 38 comparative polyol - no SBM | Ex. 39 SBM + polyol | Expected value of using SBM + polyol without synergistic effect | Added value of Synergistic effect compared to the expected value | Added value of Synergistic effect in % compared to the expected |
|---|---|---|---|---|---|---|
| Tensile modulus (MPa) | 848 | 3081 | 3025 | 1964.5 | 1060.5 | +54% |
| Bend Modulus (MPa) | 1141 | 2751 | 2886 | 1946 | 940 | +48% |
| HDT at 1.8 MPa (° C.) | 35.9 | 49.6 | 50.9 | 42.75 | 8.15 | +19% |
| Elongation at break (%) | 1.6 | 5.38 | 7.26 | 6.98 | 0.28 | +0.04% |
| GFM - 10 min (MPa) | 38.7 | 1243 | 1757 | 1281.7 | 475.3 | +37% |
| K1C (MPa · m$^{1/2}$) | 0.711 | 0.815 | 1.854 | 1.526 | 0.328 | +21.5% |
| G1C (J/m$^2$) | 373 | 204 | 1017 | 577 | 440 | +75% |

Example 42 to 44

Highlight on the Synergistic Effect Between Polyols and Block Copolymers

| | Ex. 31 Comparative | Ex. 42 | Ex. 43 | Ex. 44 |
|---|---|---|---|---|
| Epoxy | | | | |
| Uvacure 1500 | 66.43 | 62.75 | 55.39 | 46.96 |
| Tactix 123 | 4.9 | 4.9 | 4.9 | 4.9 |
| Acrylate | | | | |
| SR 399 | 2.98 | 2.98 | 2.98 | 2.98 |
| SR 499 | 14.57 | 14.57 | 14.57 | 14.57 |
| Polyols | | | | |
| Arcol LG650 | | 3.68 | 11.04 | 19.47 |
| Ratio Polyol/Block copolymer | 0 | 1 | 3 | 5 |
| Photoinitiators | | | | |
| Irgacure 184 | 2.13 | 2.13 | 2.13 | 2.13 |
| UVI 6976 | 5.31 | 5.31 | 5.31 | 5.31 |
| Copolymer | | | | |
| Nanostrength SBM AFX E21 | 3.68 | 3.68 | 3.68 | 3.68 |
| GFM -10 min (MPa) | 39 | 469 | 934 | 1757 |
| HDT at 1.8 MPa (° C.) | 35.9 | 54.4 | 52.4 | 50.9 |

Examples 45 and 46

| | Ex. 38 Comparative | Ex. 45 | Ex. 39 | Ex. 46 |
|---|---|---|---|---|
| Epoxy | | | | |
| Uvacure 1500 | 50.64 | 48.64 | 46.96 | 45.64 |
| Tactix 123 | 4.9 | 4.9 | 4.9 | 4.9 |
| Acrylate | | | | |
| SR 399 | 2.98 | 2.98 | 2.98 | 2.98 |
| SR 499 | 14.57 | 14.57 | 14.57 | 14.57 |
| Polyols | | | | |
| Arcol LG650 | 19.47 | 19.47 | 19.47 | 19.47 |
| Photoinitiators | | | | |
| Irgacure 184 | 2.13 | 2.13 | 2.13 | 2.13 |
| UVI 6976 | 5.31 | 5.31 | 5.31 | 5.31 |
| Copolymer | | | | |
| Nanostrength SBM AFX E21 | 0 | 2 | 3.68 | 5 |
| GFM -10 min (MPa) | 1243 | 1296 | 1757 | 1182 |

Examples 31, 38, 39, 42, 43, 44, 45 and 46 show the influence of the block copolymers on the greenstrength. The more the formula contains block copolymers, the higher the greenstrength till an optimum level. An optimum amount of block copolymers allows to achieve the highest HDT.

Examples 47 to 50

Curable compositions of present invention comprising block copolymers as impact modifiers are compared with curable compositions comprising core shell polymers.

Raw Materials Used in the Examples 47 to 50

|  | Trade name | Source | Chemical name |
|---|---|---|---|
| Bis-oxetane | OXT-121 | Toagosei | 1,4-bis[(3-ethyl-3-oxetanylmethoxy)methylbenzene] |
| Epoxy | Celloxid 2021P | Daicel | 3,4 epoxycyclohexylmethyl 3',4'epoxycyclohexanecarboxylate |
| Epoxy | DER332 | Dow Chemicals | Bisphenol A diglycidyl ether |
| Epoxy | Erisys GE22 | CVC | 1,4 cyclohexanedimethanol diglycidyl ether |
| SBM core-shell | Clearstrength C859 | Arkema | Core: partially crosslinked styrene/butadiene copolymer/ shell: methyl methacrylate |
| SBM block copolymers | Nanostrength SBM Powder AFX E21 | Arkema | Block copolymer: Polystyrene-polybutadiene-polymethylmethacrylate |
| Polyol | Poly G 30-280 | Arch | Polyether polyol |
| Acrylate | SR 351 | Sartomer Co. | Trimethylolpropane triacrylate |
| Acrylate | SR399 | Sartomer Co. | Dipentaerythrytol pentacrylate |
| Acrylate | SR 499 | Sartomer Co. | Ethoxylated$_6$ trimethylolpropane triacrylate |
| Free-radical photoinitiator | Irgacure 184 | Ciba Specialty Chemicals | 1-hydroxycyclohexyl phenyl ketone |
| Cationic photoinitiator | CPI6976 | Aceto Corp. | Mixture of PhS—($C_6H_4$)—$S^+Ph_2SbF_6^-$ and $Ph_2S^+$—($C_6H_4$)S($C_6H_4$)—$S^+Ph_2$—$(SbF_6^-)_2$ |

Procedures for Evaluating the Resin Compositions

Mechanical and thermal properties are determined on parts fabricated on SLA 7000 (a stereolithography apparatus supplied by 3D Systems, equipped with a solid-state laser).

Accuracy

Parts have been built and pictures show the accuracy of the parts.

Formulations Tested

The formulation were prepared in 2 steps:

1—Preparation of a masterbatch of SBM or MBS in epoxies:

The epoxy resin is heated at 50° C., under stirring, inside a five neck reactor equipped with a thermometer, a condenser, a mechanical stirrer, a N2 gas inlet and a stopper. When the temperature is reached, a selected amount of block copolymers or core shells is added stepwise, under continuous N2 flow, before the temperature is risen to 100-110° C. Stirring is maintained during 1-1.30 H at 100-110° C. Afterwards, the oil bath is removed, and the mixture is cooled down to 40° C. under continuous N2 flow and stirring conditions. Finally, the mixture is poured into a more handable container.

2—The mix of all the other components:

The formulations indicated in the following table are prepared by mixing the components with a masterbatch of block copolymers or core shells prepared as described in STEP 1), with a stirrer at 20° C., until a homogeneous composition is obtained.

|  | Example | | | |
|---|---|---|---|---|
|  | Ex. 47 Comp. | Ex. 48 | Ex. 49 | Ex. 50 Comp. |
| Bis oxetane | | | | |
| OXT-121 | 30 | 30 | 6.7 | 6.7 |
| Epoxy | | | | |
| Celloxid 2021P | 31 | 31 | 39.8 | 39.8 |
| Erisys GE22 | 15 | 15 | | |
| DER 332 | | | 5 | 5 |
| Acrylate | | | | |
| SR 351 LV | 14 | 14 | | |
| SR 499 | | | 15 | 15 |
| SR 399 | | | 3 | 3 |
| Polyol | | | | |
| Poly G30-280 | | | 18 | 18 |
| Cationic PI | | | | |
| UVI6976 | 2 | 2 | 3.5 | 3.5 |
| Free-radical PI | | | | |
| Irgacure 184 | 1 | 1 | 2 | 2 |
| Core-shell | | | | |
| Clearstrength 859 | 7 | | | 7 |
| Block copolymers | | | | |
| Nanostrength AFX E21 | | 7 | 7 | |
| Viscosity (mPa · s) at 30° C. | 88.5 | 775 | 324 | 155 |

Stability Results

The resulting masterbatch of Clearstrength 859 in epoxies leads to a white opaque resin whereas, the resulting masterbatch of Nanostrength AFX E21 in epoxies is clear yellow.

Formulations 47 and 50 phase separate after 1 day. To build parts, stirring is done prior to the beginning of the fabrication. On the contrary, 48 and 49 are stable formulations.

Accuracy of the Parts

The parts obtained from example 47 (comparative) are opaque white and are badly defined. The support side is hairy and the laser side is wavy.

The parts obtained from example 48 (inventive) are clear amber and are well defined. The corners are accurate.

The parts obtained from example 50 (comparative) are opalescent to white and are badly defined. The support side is slightly hairy and the laser side is wavy.

The shape of the parts obtained with the compositions of comparative examples 47 and 50 doesn't allow to measure the accuracy, the accuracy thereof is very poor. Whereas, parts obtained with the composition of example 49 are well defined and accurate.

CONCLUSIONS

The data shows that SBM block copolymers and MBS core-shells have a different behavior. The use of the block copolymers results in articles having improved accuracy.

The invention claimed is:

1. Curable composition comprising:
   (a) a resin composition being liquid at 23° C. and comprising monomers or oligomers or a mixture of monomers and oligomers polymerizable by a ring-opening reaction;
   (b) an impact modifier containing one or more block copolymers having at least one block-composed of methyl methacrylate and
   (c) one or more polymerization initiators selected from cationic polymerization initiators and radical polymerization initiators.

2. Curable composition according to claim 1 wherein component (a) is selected from cycloaliphatic, aromatic and hydrogenated aromatic epoxy resin compositions and any mixtures thereof.

3. Curable composition according to claim 1 wherein (a) is used in amounts of 5 to 97% by weight, based on the total weight of the composition.

4. Curable composition according to claim 1 comprising one or more block copolymers containing at least one block comprising methyl methacrylate, wherein the block copolymers form microscopic phases upon curing of the composition.

5. Curable composition according to claim 1 wherein (b) is a S-B-M-triblock copolymer or a M-B-M-triblock copolymer, wherein the S-block and the M-block independently of each other comprise vinylaromatic compounds and/or alkyl esters of acrylic acid and/or methacrylic acid having from 1 to 18 carbon atoms in the alkyl chain and the B-block comprises diene or alkyl((meth)acrylate), with the provisions that at least one of the S-block, B-block and M-block is composed of methyl methacrylate, and that the B-block is incompatible with either the S-block or the M-block.

6. Curable composition according to claim 5, Wherein the M-block comprises at least 50% by weight of methyl methacrylate monomers (M1), and the other monomers (M2) comprise non-acrylic vinyl and/or (meth)acrylic monomers different from the Monomers M1.

7. Curable composition according to claim 1 wherein (b) is used in amounts of 0.5 to 20% by weight, based on the total weight of the composition.

8. Curable composition comprising:
   (a) a resin composition being liquid at 23° C. and comprising monomers or oligomers or a mixture of monomers and oligomers polymerizable by a ring-opening reaction;
   (b) an impact modifier containing one or more block copolymers having at least one block composed of methyl methacrylate
   (c) one or more polymerization initiators and
   (d) a (meth)acrylate selected from monomeric or oligomeric aliphatic, cycloaliphatic, or aromatic (meth)acrylate compounds having 2 to 20 acrylic groups.

9. Curable composition according to claim 8, wherein the (meth)acrylate compound (d) is selected from poly(meth)acrylate derived from cyclic aliphatic compounds having two or more hydroxy groups.

10. Curable composition according to claim 8 wherein (d) is employed in amounts of 1 to 90% by weight, based on the total weight of the composition.

11. Curable composition according to claim 1 additionally comprising a polyol or a polyol-containing mixture as component (e).

12. Curable composition according to claim 11 containing the polyol (e) in an amount from 0.5 to 40% by weight, based on the total weight of the composition.

* * * * *